US011561574B2

(12) United States Patent
Park et al.

(10) Patent No.: US 11,561,574 B2
(45) Date of Patent: Jan. 24, 2023

(54) DISPLAY DEVICE

(71) Applicant: Samsung Display Co., Ltd., Yongin-si (KR)

(72) Inventors: Young Woo Park, Yongin-si (KR); Ki Ho Bang, Yongin-si (KR); Sang Hyun Jun, Yongin-si (KR); Won Suk Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/549,666

(22) Filed: Dec. 13, 2021

(65) Prior Publication Data
US 2022/0102680 A1 Mar. 31, 2022

Related U.S. Application Data

(63) Continuation of application No. 16/793,953, filed on Feb. 18, 2020, now Pat. No. 11,199,871.

(30) Foreign Application Priority Data

May 24, 2019 (KR) .......................... 10-2019-0061147

(51) Int. Cl.
G06F 3/041 (2006.01)
G06F 1/16 (2006.01)
(Continued)

(52) U.S. Cl.
CPC .......... *G06F 1/1609* (2013.01); *G06F 1/1652* (2013.01); *G06F 3/0412* (2013.01);
(Continued)

(58) Field of Classification Search
CPC .... G06F 1/1609; G06F 1/1652; G06F 3/0412; G06F 3/04164; G06F 3/0443;
(Continued)

(56) References Cited

U.S. PATENT DOCUMENTS 10,732,775 B2   8/2020  Kim et al.
10,784,316 B2   9/2020  Lee et al.
(Continued)

FOREIGN PATENT DOCUMENTS

EP          3 462 499 A2    4/2019
KR     10-2018-0025022 A    3/2018

*Primary Examiner* — Joe H Cheng
(74) *Attorney, Agent, or Firm* — Lewis Roca Rothgerber Christie LLP

(57) ABSTRACT

A display device includes a substrate including a display area, a non-display area, a first additional area connected to the non-display area at a first boundary, and a second additional area connected to the first additional area at a second boundary, pixels on the display area, an encapsulation film on the pixels, electrodes on the encapsulation film, pads on the second additional area, sensing wires connecting the electrodes and the pads, a first sensing insulating film on the encapsulation film, and a second sensing insulating film on the first sensing insulating film. The substrate includes a curved first side in the first additional area and the first additional area decreases in width from the first boundary to the second boundary, and a boundary of the first sensing insulating film is closer to the first side than a boundary of the second sensing insulating film is to the first side.

15 Claims, 27 Drawing Sheets

(51) Int. Cl.
  *G09F 9/30* (2006.01)
  *H01L 27/32* (2006.01)
  *H01L 51/00* (2006.01)
  *H01L 51/52* (2006.01)
  *G06F 3/044* (2006.01)

(52) U.S. Cl.
  CPC ............ *G09F 9/301* (2013.01); *H01L 27/323* (2013.01); *H01L 51/0097* (2013.01); *H01L 51/5253* (2013.01); *G06F 3/0443* (2019.05); *G06F 3/0446* (2019.05); *G06F 3/04164* (2019.05); *G06F 2203/04102* (2013.01); *G06F 2203/04111* (2013.01); *H01L 27/3258* (2013.01); *H01L 2251/5338* (2013.01)

(58) Field of Classification Search
  CPC ......... G06F 3/0446; G06F 2203/04102; G06F 2203/04111; G09F 9/301; H01L 27/323; H01L 27/3246; H01L 27/3248; H01L 27/3258; H01L 51/0097; H01L 51/5253
  See application file for complete search history.

(56) References Cited

U.S. PATENT DOCUMENTS

| | | | |
|---|---|---|---|
| 11,199,871 B2 * | 12/2021 | Park | ........................ G09F 9/301 |
| 2016/0018686 A1 | 1/2016 | Kim et al. | |
| 2016/0270209 A1 | 9/2016 | Cho | |
| 2017/0194411 A1 | 7/2017 | Park et al. | |
| 2017/0262109 A1 * | 9/2017 | Choi | .................. H01L 27/3258 |
| 2018/0033830 A1 | 2/2018 | Kim et al. | |
| 2018/0040672 A1 * | 2/2018 | Park | ........................ G06F 3/0443 |
| 2018/0061898 A1 | 3/2018 | Oh et al. | |
| 2018/0107316 A1 * | 4/2018 | Hanari | .................. G06F 3/0412 |
| 2018/0151662 A1 * | 5/2018 | Rhe | ........................ G06F 3/0445 |
| 2018/0182838 A1 * | 6/2018 | Yeo | ..................... H01L 51/5253 |
| 2018/0348918 A1 | 12/2018 | Rhe et al. | |
| 2019/0043418 A1 | 2/2019 | Rieutort-Louis et al. | |
| 2019/0067404 A1 | 2/2019 | Lee | |
| 2019/0074328 A1 | 3/2019 | Park | |
| 2019/0165048 A1 * | 5/2019 | Kim | .................... H01L 51/0097 |
| 2019/0265824 A1 | 8/2019 | Abe et al. | |
| 2020/0073495 A1 * | 3/2020 | Bok | ........................ G06F 1/1616 |
| 2020/0105840 A1 | 4/2020 | Choi et al. | |
| 2020/0111843 A1 * | 4/2020 | Han | ........................ G06F 3/04164 |
| 2020/0266246 A1 | 8/2020 | Bok et al. | |
| 2021/0005696 A1 * | 1/2021 | Bang | ........................ H01L 51/56 |
| 2021/0076011 A1 | 3/2021 | Ishikawa et al. | |

* cited by examiner

DISPLAY DEVICE

CROSS-REFERENCE TO RELATED APPLICATIONS

This application is a continuation of U.S. patent application Ser. No. 16/793,953, filed Feb. 18, 2020, now U.S. Pat. No. 11,199,871 B2, which claims priority to and the benefit of Korean Patent Application No. 10-2019-0061147, filed May 24, 2019, the entire content of both of which is incorporated herein by reference.

BACKGROUND

1. Field

The disclosure relates to a display device.

2. Description of the Related Art

As the information technology field develops, the importance of the display device, which is a connection medium between a user and information, increases. Accordingly, use of a display device such as a liquid crystal display device, an organic light emitting display device, and a plasma display device has been increasing.

In particular, user demand for bendable displays has been increasing. However, a large stress is applied to a bending area of the bendable display as compared with other areas of the display, and thus, a measure for substantially preventing or preventing a crack from forming due to the stress is desirable.

SUMMARY

Aspects of example embodiments are directed to a display device capable of reducing stress applied to a bending area.

A display device according to an embodiment of the disclosure includes a substrate including a display area, a non-display area surrounding an outer periphery of the display area, a first additional area connected to the non-display area at a first boundary, and a second additional area connected to the first additional area at a second boundary, pixels on the display area, an encapsulation film on the pixels, sensing electrodes on the encapsulation film, pads on the second additional area, sensing wires connecting the sensing electrodes and the pads, a first sensing insulating film on the encapsulation film, and a second sensing insulating film on the first sensing insulating film, the sensing electrodes, and the sensing wires. The substrate includes a curved first side in the first additional area and the first additional area decreases in width from the first boundary to the second boundary, and a boundary of the first sensing insulating film is closer to the first side than a boundary of the second sensing insulating film is to the first side.

The boundary of the first sensing insulating film may not be covered by the second sensing insulating film.

The substrate may include a first bending area extending from the first side to overlap the non-display area.

The boundary of the first sensing insulating film and the boundary of the second sensing insulating film may be on the first bending area.

The second additional area may include a second bending area, and the first bending area and the second bending area do not overlap.

The encapsulation film may include an organic film, the display device may further include a dam at a boundary of the organic film, and the boundary of the second sensing insulating film may be closer to the first side than to the dam.

The encapsulation film may include an organic film, the display device may further include a dam at a boundary of the organic film, and the boundary of the second sensing insulating film may be farther from the first side than to the dam.

The boundary of the second sensing insulating film may be closer to the first side than to the sensing wires.

The first sensing insulating film may be between the encapsulation film and the sensing wires.

The sensing electrodes may be on the first sensing insulating film, the display device may further include bridge electrodes under the first sensing insulating film, and the sensing electrodes may be connected to the bridge electrodes through contact holes of the first sensing insulating film.

The sensing electrodes may be under the first sensing insulating film, the display device may further include bridge electrodes on the first sensing insulating film, and the bridge electrodes may be connected to the sensing electrodes through contact holes of the first sensing insulating film.

The first sensing insulating film may be between the sensing wires and the second sensing insulating film.

The sensing electrodes may be on the first sensing insulating film, the display device may further include bridge electrodes under the first sensing insulating film, and the sensing electrodes may be connected to the bridge electrodes through contact holes of the first sensing insulating film.

The sensing electrodes may be under the first sensing insulating film, the display device may further include bridge electrodes on the first sensing insulating film, and the bridge electrodes may be connected to the sensing electrodes through contact holes of the first sensing insulating film.

A display device according to an embodiment of the disclosure includes a substrate including a display area, a non-display area surrounding an outer periphery of the display area, a first additional area connected to the non-display area at a first boundary, and a second additional area connected to the first additional area at a second boundary, pixels on the display area, an encapsulation film on the pixels, sensing electrodes on the encapsulation film, pads on the second additional area, sensing wires connecting the sensing electrodes and the pads, a first sensing insulating film on the encapsulation film, and a second sensing insulating film on the first sensing insulating film, the sensing electrodes, and the sensing wires. The substrate includes a curved first side in the first additional area and the first additional area decreases in width from the first boundary to the second boundary, and a boundary of the second sensing insulating film is spaced apart from the first side by 200 μm or more.

The first side of the first additional area and the non-display area may commonly include a first bending area, the second additional area may include a second bending area, and the first bending area and the second bending area do not overlap.

The encapsulation film may include an organic film, the display device may further include a dam at a boundary of the organic film, and the boundary of the second sensing insulating film may be closer to the first side than to the dam.

The encapsulation film may include an organic film, the display device may further include a dam at a boundary of the organic film, and the boundary of the second sensing insulating film may be farther from the first side than to the dam.

The boundary of the second sensing insulating film may be closer to the first side than to the sensing wires.

A display device according to an embodiment of the disclosure includes a substrate including a display area, a non-display area surrounding an outer periphery of the display area, a first additional area connected to the non-display area at a first boundary, and a second additional area connected to the first additional area at a second boundary, pixels on the display area, an encapsulation film on the pixels, sensing electrodes on the encapsulation film, pads on the second additional area, sensing wires connecting the sensing electrodes and the pads, and a sensing insulating film on the sensing electrodes and the sensing wires. The substrate includes a curved first side in the first additional area and the first additional area decreases in width from the first boundary to the second boundary, the substrate includes a first bending area extending from the first side to overlap the non-display area, and, in the first bending area, a boundary of the sensing insulating film is farther from the first side from a first point of the first side crossing (e.g., intersecting) the first boundary than to a second point of the first side crossing (e.g., intersecting) the second boundary.

Aspects of example embodiments of the display device according to the disclosure are directed to reducing stress applied to a bending area.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
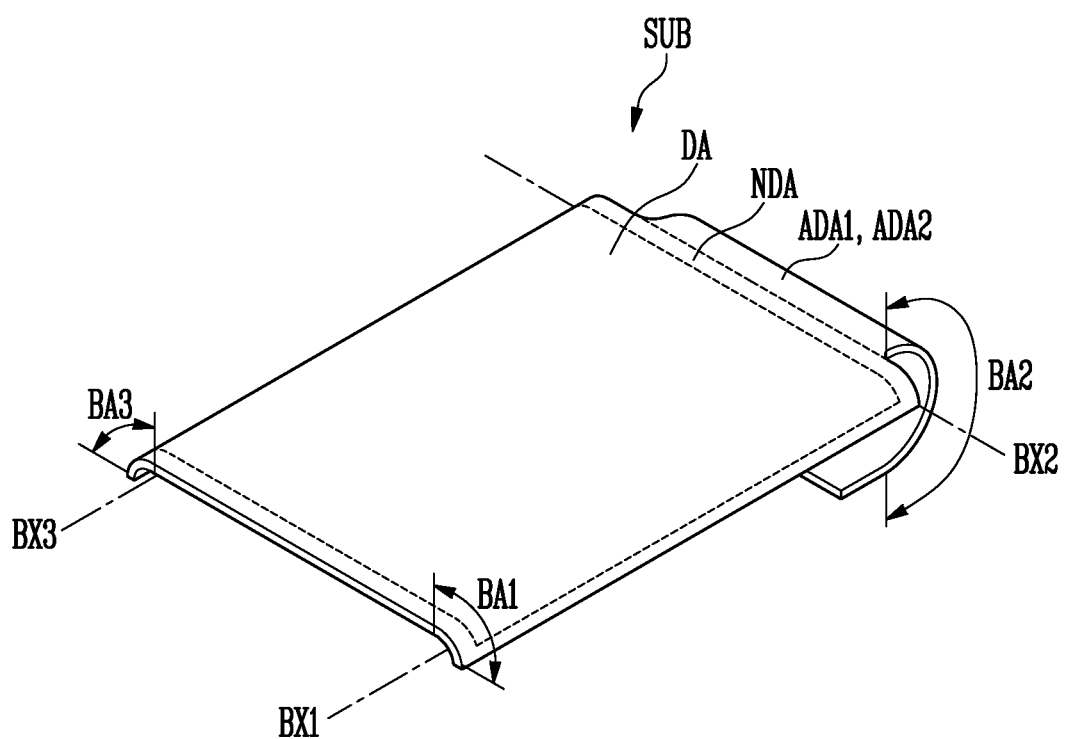
FIG. 1 is a diagram for describing a substrate according to an embodiment of the disclosure.

Hereinafter, various embodiments of the disclosure will be described in more detail with reference to the accompanying drawings so that those skilled in the art may easily carry out the disclosure. The disclosure may be implemented in various different forms and is not limited to the embodiments described herein.

In order to clearly describe the disclosure, parts that are not related to the description are omitted, and the same or similar elements are denoted by the same reference numerals throughout the specification. Therefore, the above-described reference numerals may be used in other drawings.

In addition, sizes and thicknesses of each component shown in the drawings are arbitrarily shown for convenience of description, and thus the disclosure is not necessarily limited to those shown in the drawings. In the drawings, thicknesses may be exaggerated to clearly express various layers and areas.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of,"

when preceding a list of elements, modify the entire list of elements and do not modify the individual elements of the list. Further, the use of "may" when describing embodiments of the inventive concept refers to "one or more embodiments of the inventive concept."

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
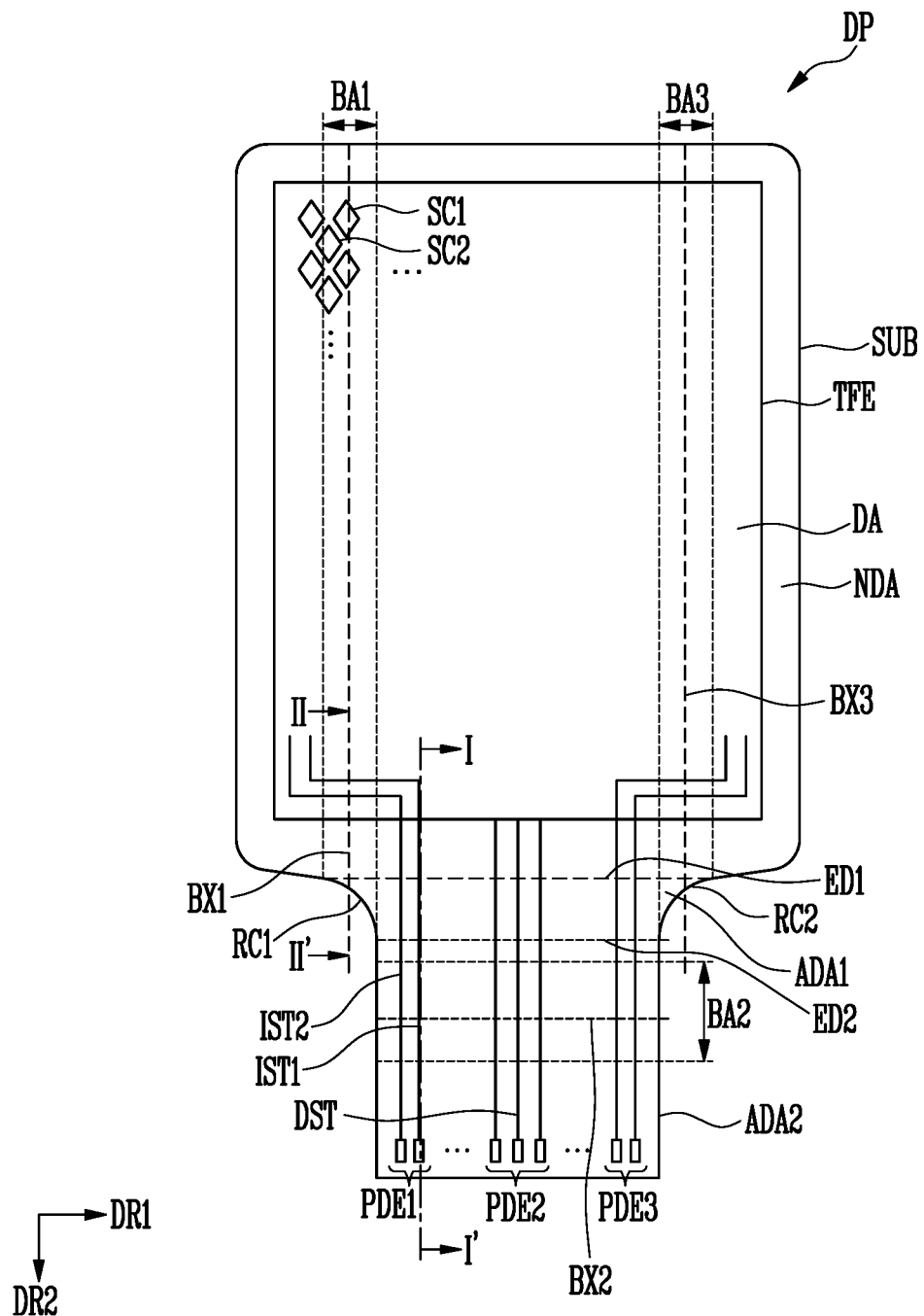
FIG. 2 is a diagram for describing a display device according to an embodiment of the disclosure.

FIG. 1 is a diagram for describing a substrate according to an embodiment of the disclosure, and FIG. 2 is a diagram for describing a display device according to an embodiment of the disclosure.

In the following embodiments, a plane may define a position in a first direction DR1 and a second direction DR2, and a height may define a position in a third direction DR3 (refer to FIG. 5). The first direction DR1, the second direction DR2, and the third direction DR3 may be directions orthogonal to each other.

The substrate SUB may include a display area DA, a non-display area NDA, a first additional area ADA1, and a second additional area ADA2.

The display area DA may have a quadrangle shape (e.g., a rectangular shape). Each corner of the display area DA may be angular or curved. In addition, in a case of a circular display, the display area DA may have a circular shape (e.g., a perfect circle or an ellipse). In addition, the display area DA may be another shape such as a polygon other than a quadrangle, an ellipse, or the like. As described above, a shape of the display area DA may be set differently depending on a product.

Pixels may be positioned on the display area DA. Each pixel may include a light emitting diode or may include a liquid crystal layer according to a type of a display device DP.

The non-display area NDA may surround an outer periphery of the display area DA. For example, the non-display area NDA may have a rectangular shape. Each corner of the non-display area NDA may be angular or curved. FIG. 2 shows a case where each corner of the non-display area NDA has a curved shape. The non-display area NDA may have a circular shape. Because minimizing or reducing the non-display area NDA is advantageous to produce a narrow bezel structure, a shape of the non-display area NDA may be like the shape of the display area DA.

The first additional area ADA1 may be positioned between the non-display area NDA and the second additional area ADA2. The first additional area ADA1 may be connected to the non-display area NDA at a first boundary ED1. The first additional area ADA1 may be connected to the second additional area ADA2 at a second boundary ED2. Each of the first boundary ED1 and the second boundary ED2 may extend in the first direction DR1.

A width of the first additional area ADA1 may be narrower or decrease from the first boundary ED1 to the second boundary ED2. That is, the width of the first additional area ADA1 in the first direction DR1 may be narrower or decrease toward the second direction DR2. Therefore, the first additional area ADA1 may include a curved first side RC1 and a curved second side RC2. The sides RC1 and RC2 may be convex toward an inside of the substrate (e.g., a center of the substrate).

FIG. 2 shows that the first additional area ADA1 includes the two sides (e.g., two opposing sides) RC1 and RC2 in the first direction DR1 and a direction opposite to the first direction DR1. In other words, the first side RC1 and the second side RC2 are oppositely aligned and define a left side and a right side of the first additional area ADA1. In an embodiment, a boundary positioned in the first direction DR1 may coincide with a boundary of the non-display area NDA, and thus the first additional area ADA1 may include only the first side RC1. In an embodiment, a boundary positioned in the direction opposite to the first direction DR1 may coincide with the boundary of the non-display area NDA, and thus the first additional area ADA1 may include only the second side RC2.

The second additional area ADA2 may have a rectangular shape. Each corner positioned in the second direction DR2 of the second additional area ADA2 may be angular or curved. FIG. 2 is an example embodiment where each corner positioned in the second direction DR2 of the second additional area ADA2 is angular.

An encapsulation film TFE may be positioned on the pixels. For example, the encapsulation film TFE may cover the pixels in the display area DA, and a boundary of the encapsulation film TFE may be positioned in the non-display area NDA. The encapsulation film TFE may cover light emitting elements and the circuit elements of the pixels of the display area DA to prevent or reduce exposure to external moisture and/or prevent or substantially prevent breakage from an impact.

Sensing electrodes SC1 and SC2 may be positioned on the encapsulation film TFE. The sensing electrodes SC1 and SC2 may sense a user's touch, hovering, gesture, proximity, and the like. The sensing electrodes SC1 and SC2 may be configured in different shapes according to various methods such as a resistive type (or method), a capacitive type (or method), an electro-magnetic type (or method), and/or an optical type (or method). For example, when the sensing electrodes SC1 and SC2 are configured as the capacitive type, the sensing electrodes SC1 and SC2 may be configured as a self-capacitive type, a mutual-capacitive type, or the like.

When the sensing electrodes SC1 and SC2 are configured as the self-capacitive type, each of the sensing electrodes SC1 and SC2 may be independently driven, sensing signals corresponding to capacitances formed by the each of the sensing electrodes SC1 and SC2 and the body of the user may be provided to corresponding sensing wires IST1 and IST2.

When the sensing electrodes SC1 and SC2 are configured as the mutual-capacitive type, a driving signal may be transmitted through a sensing wire corresponding to the first sensing electrode SC1, and a sensing signal may be received through a sensing wire corresponding to the second sensing electrode SC2 forming a mutual capacitance with the first sensing electrode SC1. When a user is in a sufficiently close proximity to the sensing electrodes, the mutual capacitance between the first sensing electrode SC1 and the second sensing electrode SC2 changes, and thus the touch of the user may be detected based on a difference of the sensing signal according to the change in the mutual capacitance. In an embodiment, a driving signal may be transmitted through the sensing wire corresponding to the second sensing electrode SC2, and a sensing signal may be received through a sensing wire corresponding to the first sensing electrode SC1 for forming a mutual capacitance with the second sensing electrode SC2.

Pads PDE1, PDE2, and PDE3 may be positioned on the second additional area ADA2. The pads PDE1 and PDE3 may be connected to the sensing electrodes SC1 and SC2 positioned above the encapsulation film through the sensing wires IST1 and IST2. The pads PDE1 and PDE3 may be connected to an external touch integrated chip ("IC"). In addition, the pads PDE2 may be connected to the pixels positioned under the encapsulation film TFE or a driver of the pixels through display wires DST. The driver may include a scan driver, a light emitting driver, a data driver, and the like. The driver may be positioned under the encapsulation film TFE or may be positioned in an external display IC connected through the pads PDE2.

When the display device DP includes mutual capacitive sensing, a touch IC may transmit the driving signal through the first sensing wire IST1 and receive the sensing signal through the second sensing wire IST2. In an embodiment, the driving signal may be transmitted through the second sensing wire IST2 and the sensing signal may be received through the first sensing wire IST1. When the display device DP includes self-capacitance sensors, a driving method of the first sensing wire IST1 and the second sensing wire IST2 may be the same. The display wires DST may include a control line, a data line, a power line, and the like, and may provide signals so that the pixels may display an image. The signals may be provided from the driver connected to the display wires DL.

FIG. 1 shows a state in which the substrate SUB is bent, and FIG. 2 shows a state in which the substrate SUB is not bent. The display device DP may be bent as shown in FIG. 1 after elements are stacked on the substrate SUB in a state in which the display device DP is not bent as shown in FIG. 2.

The substrate SUB may include a first bending area BA1 extending from the first side RC1 of the first additional area ADA1 to overlap the non-display area NDA. Additionally, the first bending area BA1 may be extended to overlap the display area DA. That is, each of the display area DA, the non-display area NDA, and the first additional area ADA1 may partially overlap the first bending area BA1. The first bending area BA1 may have a width in the first direction DR1 and a length extending in the second direction DR2. A first bending axis BX1 may be defined as a folding line extending in the second direction DR2 through a center of the first bending area BA1. According to an embodiment, the first bending area BA1 may be a portion where a stress is reduced due to removal of a portion of an insulating film or the like. Therefore, the first bending area BA1 may have a portion of the insulating film or the like removed unlike other portions around the first bending area BA1. According to an embodiment, the first bending area BA1 may have the same configuration as the other portions around the first bending area BA1. In other words, the first bending area BA1 may not have a portion of the insulating film removed.

The substrate SUB may include a third bending area BA3 extending from the second side RC2 of the first additional area ADA1 to overlap the non-display area NDA. Additionally, the third bending area BA3 may be extended to overlap the display area DA. That is, each of the display area DA, the non-display area NDA, and the first additional area ADA1 may partially overlap the third bending area BA3. The third bending area BA3 may have a width in the first direction DR1 and a length extending in the second direction DR2. A third bending axis BX3 may be defined as a folding line extending in the second direction DR2 through a center of the third bending area BA3. According to an embodiment, the third bending area BA3 may be a portion where the stress is reduced by removal of a portion of the insulating film or the like. Therefore, the third bending area BA3 may have a portion of the insulating film or the like removed in contrast to other portions around the third bending area BA3. According to an embodiment, the third bending area BA3 may have the same configuration as the other portions around the third bending area BA3. In other words, the third bending area BA3 may not have a portion of the insulating film removed.

The second additional area ADA2 may include a second bending area BA2. The second bending area BA2 may have a width in the second direction DR2 and a length extending in the first direction DR1. A second bending axis BX2 may be defined as a folding line extending in the first direction DR1 through a center of the second bending area BA2. According to an embodiment, the second bending area BA2 may be a portion where the stress is reduced due to removal of a portion of the insulating film or the like. Therefore, the second bending area BA2 may have a portion of the insulating film or the like removed in contrast to other portions around the second bending area BA2. According to an embodiment, the second bending area BA2 may have the same configuration as the other portions around the second bending area BA2. In other words, the second bending area BA2 may not have a portion of the insulating film removed.

In one or more embodiments, the first to third bending areas BA1, BA2, and BA3 do not overlap with each other.

Here, the term "folded" is intended to refer to a shape that is not fixed and may be modified from its original form to another form, and may refer to being folded, curved, or rolled along one or more bending axes. A side bezel width of the first direction DR1 and the direction opposite to the first direction DR1 of the display device DP may be reduced by the first and third bending areas BA1 and BA3. In addition, a side bezel width of the second direction DR2 of the display device DP may be reduced by the second bending area BA2.

Figure 3:
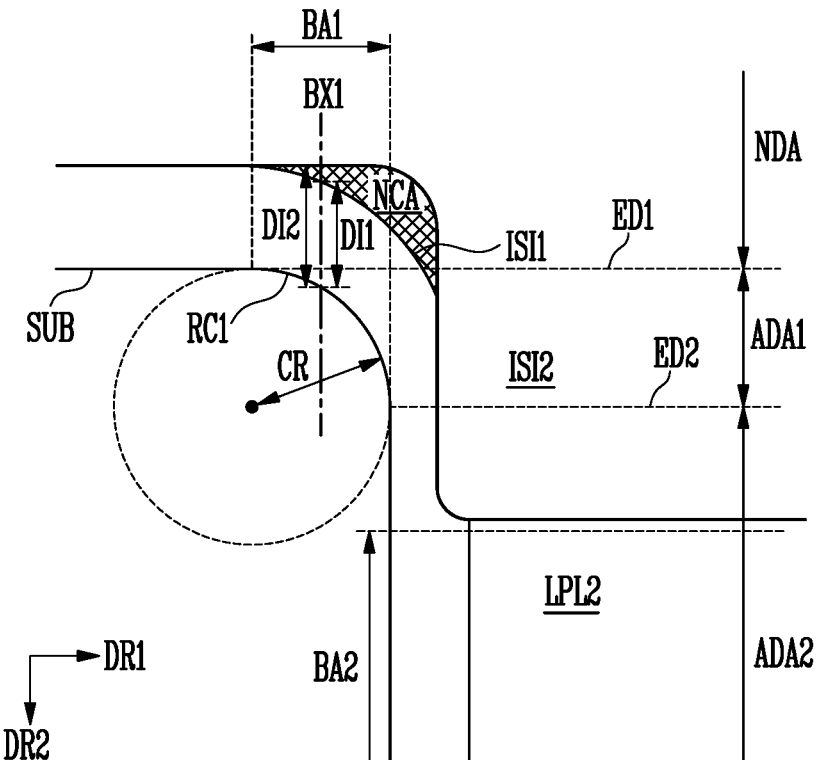
FIG. 3 is an enlarged view of a portion of a first additional area of FIG. 2.
Figure 4:
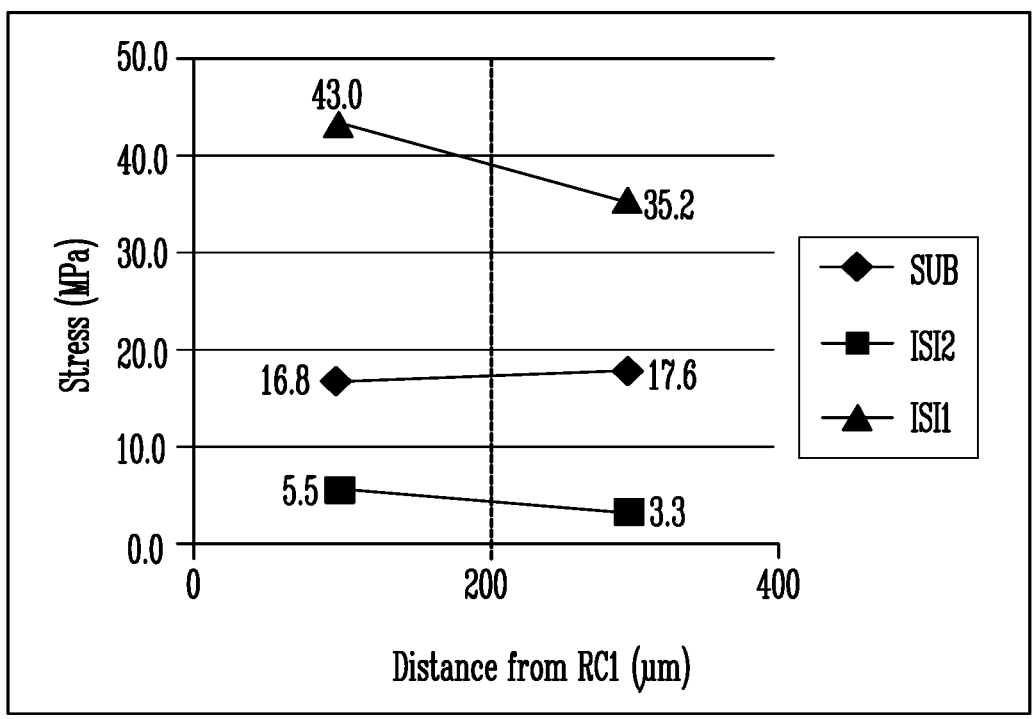
FIG. 4 is a diagram for describing an effect of increasing a separation distance of a second sensing insulating film from a first side.

FIG. 3 is an enlarged view of a portion of the first additional area ADA1 of FIG. 2, and FIG. 4 is a diagram for describing an effect of increasing a separation distance of a second sensing insulating film from the first side RC1.

Specifically, FIG. 3 shows an enlarged view of the non-display area NDA, the first additional area ADA1, and the second additional area ADA2 in the vicinity of the first side RC1. However, in one or more embodiments, the description of the embodiment in FIG. 3 may be applied to the second side RC2 as well as the first side RC1.

A first sensing insulating film ISI1 may be positioned on the encapsulation film TFE. The first sensing insulating film ISI1 may cover at least some of the sensing electrodes SC1 and SC2, the sensing wires IST1 and IST2, and bridge electrodes CP1 and CP2 (refer to FIGS. 18 and 19).

A second sensing insulating film ISI2 may be positioned on the first sensing insulating film ISI1, the sensing electrodes SC1 and SC2, and the sensing wires IST1 and IST2. The second sensing insulating film ISI2 may cover the sensing electrodes SC1 and SC2 and the sensing wires IST1 and IST2 in the display area DA, the non-display area NDA, and the first additional area ADA1. According to an embodiment, the second sensing insulating film ISI2 may additionally cover the sensing wires IST1 and IST2 in the second additional area ADA2.

According to an embodiment, the second sensing insulating film ISI2 may cover at least a portion of a second wire protective film LPL2. The second wire protective film LPL2 may cover the sensing wires IST1 and IST2 and the display wires DST passing through the second bending area BA2.

The first side RC1 may be curved with a radius of curvature CR. As the radius of curvature CR increases, a space where the sensing wires IST1 and IST2 or the display wires DST are to be disposed decreases and may be insufficient. Therefore, reducing the radius of curvature CR may be desirable to fit the sensing wires IST1 and IST2 or the display wires DST. However, a stress applied to the first bending area BA1 increases as the radius of curvature CR is smaller or reduced. In this case, a crack may occur in the second sensing insulating film ISI2.

The first additional area ADA1 may be referred to as a stress relaxation area. As the radius of curvature CR is large, the length of the first additional area ADA1 in the second direction DR2 may be increased, and the width of the first additional area ADA1 in the first direction DR1 may be reduced. In this case, as described above, the stress applied to the first bending area BA1 may be reduced, but the space where the wires IST1, IST2, and DST to be disposed may be insufficient. On the other hand, as the radius of curvature CR decreases, the length of the first additional area ADA1 in the second direction DR2 may be reduced, and the width of the first additional area ADA1 in the first direction DR1 may be increased. In this case, as described above, the stress applied to the first bending area BA1 may be increased, but the available space where the wires IST1, IST2, and DST are to be disposed increases.

Referring to FIG. 4, it may be seen that as a distance from the first side RC1 increases, a stress applied to the first sensing insulating film ISI1, and the second sensing insulating film ISI2 is reduced.

The first sensing insulating film ISI1 may be configured of an inorganic film, and a crack may occur when a stress of 500 MPa or more is applied. As it can be seen from FIG. 4, even though the first side RC1 is close to the first sensing insulating film ISI1, a possibility that a crack occurs in the first sensing insulating film ISI1 is low because the stress applied to the first sensing insulating film ISI1 is about 43 MPa.

The second sensing insulating film ISI2 may be configured of an organic film, and a crack may occur when a stress of 6 MPa or more is applied. When the second sensing insulating film ISI2 is close to the first side RC1, a possibility that a crack occurs in the second sensing insulating film ISI2 is high because a stress of about 5.5 MPa may occur in the second sensing insulating film ISI2.

Therefore, it is desirable for the second sensing insulating film ISI2 to be sufficiently spaced apart from the first side RC1. According to an experiment result, it was confirmed that when the boundary of the second sensing insulating film ISI2 is spaced apart from the first side RC1 by 200 μm or more, a possibility that a crack occurs in the second sensing insulating film ISI2 is significantly reduced.

Therefore, when the boundary of the second sensing insulating film ISI2 is sufficiently spaced apart from the first side RC1, the stress applied to the second sensing insulating film ISI2 may be reduced, and thus there is an advantage in that the radius of curvature CR of the first side RC1 may be further reduced without undesirably increasing the possibility that a crack occurs in the second sensing insulating film ISI2.

In an embodiment, at least some boundary of the first sensing insulating film ISI1 may be closer to the first side RC1 than at least some boundary of the second sensing insulating film ISI2. That is, a first distance DI1 between the at least some boundary of the first sensing insulating film ISI1 and the first side RC1 may be less than a second distance DI2 between the at least some boundary of the second sensing insulating film ISI2 and the first side RC1. For example, the first distance DI1 and the second distance DI2 may be distances on the first bending axis BX1.

According to such an embodiment, the at least some boundary of the first sensing insulating film ISI1 may not be covered by the second sensing insulating film ISI2. For example, the at least some boundary of the first sensing insulating film ISI1 may be exposed by the second sensing insulating film ISI2. That is, in the vicinity of the first side RC1, a non-covered area ("NCA") may exist in the first sensing insulating film ISI1.

The at least some boundary of the first sensing insulating film ISI1 and the at least some boundary of the second sensing insulating film ISI2 described above may be positioned on the first bending area BA1.

Figure 5:
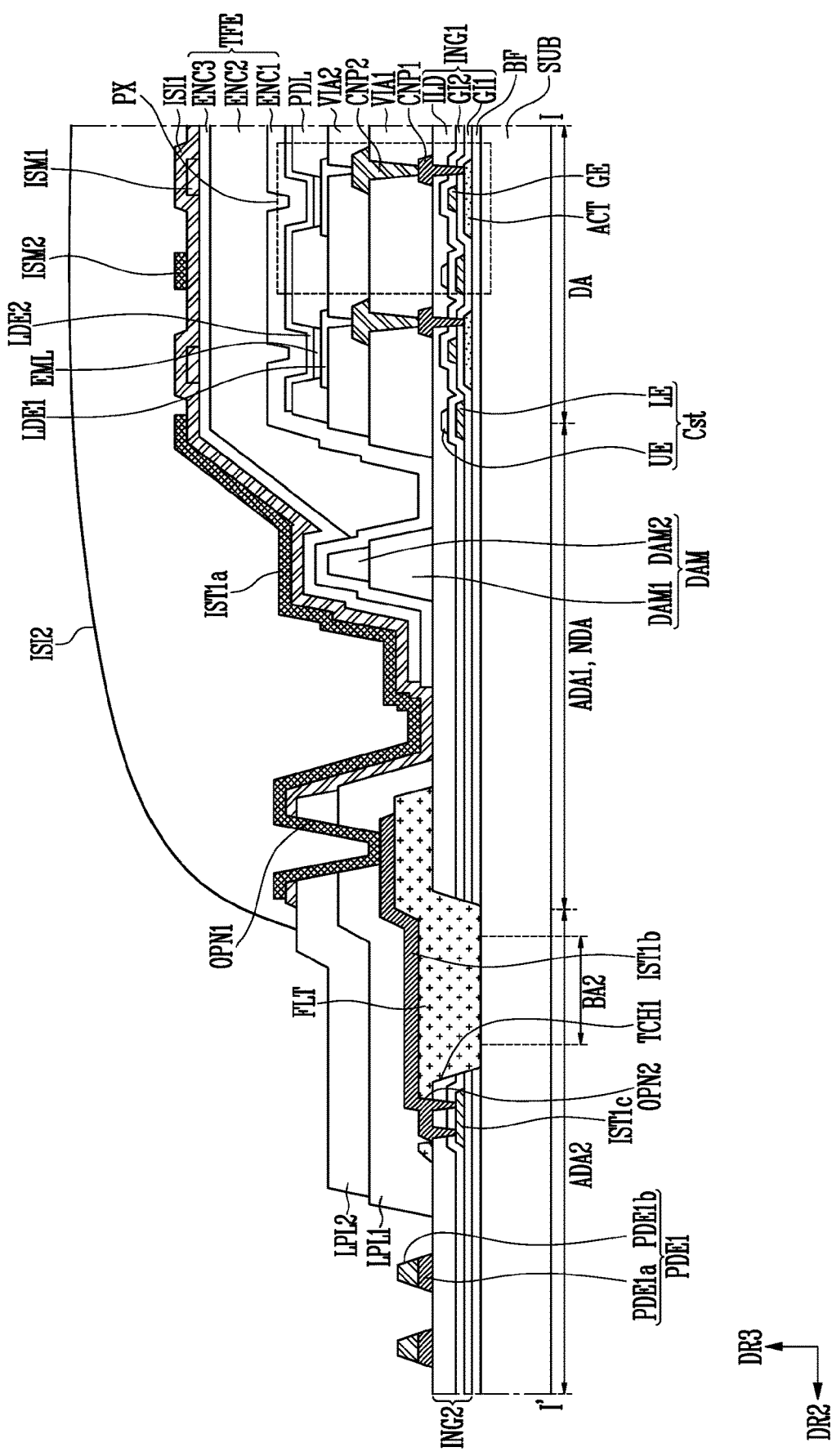
FIG. 5 is an embodiment of a cross section taken along a line I-I' of FIG. 2.

FIG. 5 is an embodiment of a cross section taken along a line I-I' of FIG. 2. It is assumed that the line I-I' of FIG. 2 passes through the first pad PDE1 and the first sensing wire IST1.

First, the display area DA will be described.

In an embodiment of the disclosure, pixels PX are provided in the display area DA. Each pixel PX may include a transistor connected to a corresponding wire of the display wires DST, a light emitting element connected to the transistor, and a capacitor Cst. In FIG. 5, for convenience of description, one transistor, one light emitting element, and one capacitor Cst are shown for one pixel PX as an example.

The substrate SUB may be formed of an insulating material such as glass and/or resin. In addition, the substrate SUB may be formed of a material having flexibility so as to be bent or folded, and may have a single-layer structure or a multilayer structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material configuring the substrate SUB may be variously changed, and may be formed of fiber reinforced plastic ("FRP") or the like.

For example, when the substrate SUB has a multilayer structure, inorganic material(s) such as silicon nitride, silicon oxide, and/or silicon oxynitride may be interposed between a plurality of layers as a single-layer or as a plurality of layers.

A buffer film BF may cover the substrate SUB. The buffer film BF may substantially prevent or prevent an impurity from diffusing into a channel CH of the transistor. The buffer film BF may be an inorganic insulating film formed of an inorganic material. For example, the buffer film BF may be formed of silicon nitride, silicon oxide, silicon oxynitride and/or the like, and in one or more embodiments, the buffer film BF may be omitted depending on the material of the substrate SUB and a process condition. According to an embodiment, a barrier layer may further be provided.

An active film ACT may be positioned on the buffer film BF. The active film ACT may be patterned to configure the channel, a source electrode, and a drain electrode of the transistor, or to configure a wire. The active film ACT may be formed of a semiconductor material. The active film ACT may be a semiconductor pattern formed of polysilicon, amorphous silicon, oxide semiconductor, or the like. The channel of the transistor is a semiconductor pattern which is not doped with an impurity, and may be an intrinsic semiconductor. The source electrode, the drain electrode, and the wire may be a semiconductor pattern doped with an impurity. An impurity such as an n-type impurity (e.g., impurity used to provide n-type doping), a p-type impurity (e.g., impurity used to provide p-type doping), and/or other metals may be used.

The first gate insulating film Gil may cover the active film ACT. The first gate insulating film Gil may be an inorganic insulating film formed of an inorganic material. As the inorganic material, an inorganic insulating material such as polysiloxane, silicon nitride, silicon oxide, or silicon oxynitride may be used.

A gate electrode GE of the transistor and a lower electrode LE of the capacitor Cst may be positioned on the first gate insulating film GI1. The gate electrode GE may overlap an area corresponding to the channel CH.

The gate electrode GE and the lower electrode LE may be formed of a metal. For example, the gate electrode GE may be formed of at least one of a metal such as gold (Au), silver (Ag), aluminum (Al), molybdenum (Mo), chromium (Cr), titanium (Ti), nickel (Ni), neodymium, or copper (Cu), and/or an alloy of metals. In addition, the gate electrode GE may be formed of a single film, but is not limited thereto, and may be formed of multiple films in which two or more materials of metals and/or alloys are stacked.

A second gate insulating film GI2 may cover the gate electrode GE and the lower electrode LE. The second gate insulating film GI2 may be an inorganic insulating film formed of an inorganic material. As the inorganic material, polysiloxane, silicon nitride, silicon oxide, silicon oxynitride, and/or the like may be used.

An upper electrode UE of the capacitor Cst may be positioned on the second gate insulating film GI2. The upper electrode UE of the capacitor Cst may be formed of a metal. For example, the upper electrode UE may be formed of at least one of a metal such as gold (Au), silver (Ag), aluminum (Al), molybdenum (Mo), chromium (Cr), titanium (Ti), nickel (Ni), neodymium, or copper (Cu), and/or an alloy of metals. In addition, the upper electrode UE may be formed of a single film, but not limited thereto, and may be formed of multiple films in which two or more materials of metals and/or alloys are stacked.

The lower electrode LE and the upper electrode UE may form the capacitor Cst with the second gate insulating film GI2 interposed therebetween. In FIG. 5, the capacitor Cst is shown as a two layer electrode structure of the lower electrode LE and the upper electrode UE. However, in one or more embodiments, the capacitor Cst may be configured as a three layer electrode structure using the active film ACT or a three layer electrode structure using an electrode of the same layer as a first connection pattern CNP1, or an electrode structure of four or more layers.

An interlayer insulating film ILD may cover the upper electrode UE. The interlayer insulating film ILD may be an inorganic insulating film formed of an inorganic material. As the inorganic material, polysiloxane, silicon nitride, silicon oxide, silicon oxynitride, and/or the like may be used.

In the present embodiment, for convenience of description, the first gate insulating film GI1, the second gate insulating film GI2, and the interlayer insulating film ILD may be referred to as a first insulating film group ING1. The first insulating film group ING1 may cover a portion of the transistor. According to an embodiment, the first insulating film group ING1 may further include the buffer film BF.

The first connection pattern CNP1 may be positioned on the interlayer insulating film ILD. The first connection pattern CNP1 may be in contact with each of a source electrode and a drain electrode of the active film ACT through a contact hole formed through the interlayer insulating film ILD, the second gate insulating film GI2, and the first gate insulating film GI1.

The first connection pattern CNP1 may be formed of a metal. For example, the source electrode SE and the drain electrode DE may be formed of at least one of a metal such as gold (Au), silver (Ag), aluminum (Al), molybdenum (Mo), chromium (Cr), titanium (Ti), nickel (Ni), neodymium, copper (Cu), and/or an alloy of metals.

According to an embodiment, a passivation film may cover the first connection pattern CNP1. The passivation film may be an inorganic insulating film formed of an inorganic material. An inorganic material such as polysiloxane, silicon nitride, silicon oxide, silicon oxynitride, and/or the like may be used for the passivation film The first via film VIA1 may cover the passivation film or the transistor. The first via film VIA1 may be an organic insulating film formed of an organic material. As the organic material, an organic insulating material such as a polyacrylic compound, a polyimide compound, a fluorocarbon compound such as Teflon, and/or a benzocyclobutene compound may be used. The organic film may be deposited by a method such as evaporation.

The second connection pattern CNP2 may be connected to the first connection pattern CNP1 through an opening portion of the first via film VIA1. The second connection pattern CNP2 may be formed of a metal such as gold (Au), silver (Ag), aluminum (Al), molybdenum (Mo), chromium (Cr), titanium (Ti), nickel (Ni), neodymium, copper (Cu), and/or an alloy of metals.

The second via film VIA2 may cover the first via film VIA1 and the second connection pattern CNP2. The second via film VIA2 may be an organic insulating film formed of an organic material. As the organic material, an organic insulating material such as a polyacrylic compound, a polyimide compound, a fluorocarbon compound such as Teflon, and/or a benzocyclobutene compound may be used.

A first light emitting element electrode LDE1 may be connected to the second connection pattern CNP2 through an opening portion of the second via film VIA2. Here, the first light emitting element electrode LDE1 may be an anode of the light emitting element according to an embodiment.

According to an embodiment, a configuration of the second via film VIA2 and the second connection pattern CNP2 may be omitted and the first light emitting element electrode LDE1 may be directly connected to the first connection pattern CNP1 through the opening portion of the first via film VIA1.

The first light emitting element electrode LDE1 may be formed of a metal film such as Ag, Mg, Al, Pt, Pd, Au, Ni, Nd, Ir, Cr, an alloy thereof, indium tin oxide ("ITO"), indium zinc oxide ("IZO"), zinc oxide ("ZnO"), indium tin zinc oxide ("ITZO"), and/or the like. The first light emitting element electrode LDE1 may be formed of one kind of metal, but is not limited thereto, and may be formed of two or more kinds of metals, for example, an alloy of Ag and Mg.

The first light emitting element electrode LDE1 may be formed of a transparent conductive film when an image is to be provided in a downward direction of the substrate SUB, and the first light emitting element electrode LDE1 may be formed of a metal reflective film and/or a transparent conductive film when an image is to be provided in an upward direction of the substrate SUB.

A pixel definition layer PDL for partitioning a light emitting area of each pixel PX is provided on the substrate SUB on which the first light emitting element electrode LDE1 and the like are formed. The pixel definition layer PDL may be an organic insulating layer formed of an organic material. An organic insulating material such as a polyacrylic compound, a polyimide compound, a fluorocarbon compound such as Teflon, or a benzocyclobutene compound may be used for the pixel definition layer PDL.

The pixel definition layer PDL may expose an upper surface of the first light emitting element electrode LDE1 and may be protruded from the substrate SUB along a periphery of the pixel PX. A light emitting film EML may be provided in an area of the pixel PX surrounded by the pixel definition film PDL.

The light emitting film EML may include a low molecular material or a high molecular material. Examples of the low molecular material may include copper phthalocyanine (CuPc), N, N-di (naphthalen-1-yl)-N, N'-diphenyl-benzidine (N, N'-Di(naphthalene-1-yl)-N, N'-diphenyl-benzidine (NPB), tris-8-hydroxyquinoline aluminum (Alq3), and the like. These materials may be formed by a vacuum deposition method. Examples of the high molecular material may include PEDOT, poly-phenylenevinylene ("PPV"), polyfluorene, and the like.

The light emitting film EML may be provided as a single-layer, but may be provided as multiple layers including various functional layers. When the light emitting film EML is multiple layers, the light emitting film EML may have a structure in which a hole injection layer ("HIL"), a hole transport layer ("HTL"), an emission layer ("EML"), an electron transport layer ("ETL"), an electron injection layer ("EIL"), and the like are stacked in a single or composite structure. The light emitting film EML may be formed by a screen printing method, an inkjet printing method, a laser induced thermal imaging ("LITI") method, or the like.

According to an embodiment, at least a portion of the light emitting film EML may be integrally formed over a plurality of first light emitting element electrodes LDE1, and may also be individually provided to correspond to the plurality of first light emitting element electrodes LDE1, respectively.

A second light emitting element electrode LDE2 may be provided on the light emitting film EML. The second light emitting element electrode LDE2 may be provided for each pixel PX, but may be provided to cover most of the display area DA and may be shared by the plurality of pixels PX.

The second light emitting element electrode LDE2 may be used as a cathode or an anode according to an embodiment. When the first light emitting element electrode LDE1 is an anode, the second light emitting element electrode LDE2 may be used as a cathode. When the first light emitting element electrode LDE1 is a cathode, the second light emitting element electrode LDE2 may be used as an anode.

The second light emitting element electrode LDE2 may be formed of a metal film such as Ag, Mg, Al, Pt, Pd, Au, Ni, Nd, Ir or Cr, a transparent conductive film such as indium tin oxide ("ITO"), indium zinc oxide ("IZO"), zinc oxide ("ZnO"), indium tin zinc oxide ("ITZO"), and/or the like. In an embodiment of the disclosure, the second light emitting element electrode LDE2 may be formed of multiple films of two or more films including a metal thin film, and for example, the second light emitting element electrode LDE2 may be formed of a triple film of ITO/Ag/ITO.

The second light emitting element electrode LDE2 may be formed of a metal reflective film and/or a transparent conductive film when an image is to be provided in a downward direction of the substrate SUB, and the second light emitting element electrode LDE2 may be formed of a transparent conductive film when an image is to be provided in an upward direction of the substrate SUB.

A set of the first light emitting element electrode LDE1, the light emitting film EML, and the second light emitting element electrode LDE2 may be referred to as a light emitting element.

The encapsulation film TFE may be provided on the second light emitting element electrode LDE2. The encapsulation film TFE may be formed of a single-layer, but may also be formed of multiple layers. In the present embodiment, the encapsulation film TFE may include first to third encapsulation films ENC1, ENC2, and ENC3. The first to third encapsulation films ENC1, ENC2 and ENC3 may be formed of an organic material and/or an inorganic material. The third encapsulation film ENC3 positioned at an outermost periphery may be formed of an inorganic material. For example, the first encapsulation film ENC1 may be an inorganic film configured of an inorganic material, the second encapsulation film ENC2 may be an organic film configured of an organic material, and the third encapsulation film ENC3 may be an inorganic film configured of an inorganic material. Penetration of moisture or oxygen into the inorganic material is less than that of the organic material. However, the inorganic material is vulnerable to cracks because elasticity or flexibility of the inorganic material may be low. Propagation of a crack may be prevented or reduced by forming the first encapsulation film ENC1 and the third encapsulation film ENC3 with the inorganic material and forming the second encapsulation film ENC2 with the organic material. Here, a layer formed of the organic material, that is, the second encapsulation film ENC2, may be completely covered by the third encapsulation film ENC3 so that an end portion is not exposed to the outside. As the organic material, an organic insulating material such as a polyacrylic compound, a polyimide compound, a fluorocarbon compound such as Teflon, and/or a benzocyclobutene compound may be used. As the inorganic material, polysiloxane, silicon nitride, silicon oxide, silicon oxynitride, or the like may be used.

The light emitting film EML forming the light emitting element may be easily damaged by moisture or oxygen from the outside. The encapsulation film TFE protects the light emitting elements by covering the light emitting film EML. The encapsulation film TFE covers the display area DA and may extend to the non-display area NDA outside the display area DA. However, in a case of insulating films formed of an organic material, there is an advantage in terms of flexibility and elasticity, but moisture and oxygen may more easily penetrate an insulating film formed of an organic material than an insulating film formed of an inorganic material. In an embodiment of the disclosure, in order to prevent or to reduce penetration of moisture or oxygen through insulating films formed of an organic material, the end portion of the insulating films formed of the organic material may be covered by insulating films formed of an inorganic material so as not to be exposed to the outside. For example, the first via film VIA1, the second via film VIA2, and the pixel definition film PDL, which are formed of an organic material, do not extend continuously to the non-display area NDA, and may be covered by the first encapsulation film ENC1. Therefore, an upper surface of the pixel definition layer PDL and sides of the first via film VIA1, the second via film VIA2, and the pixel definition film PDL may be substantially prevented or prevented from being exposed to the outside by being sealed by encapsulation film TFE including the inorganic material.

However, whether the encapsulation film TFE is formed of a plurality of layers or a material of the encapsulation film TFE is not limited thereto, and may be variously changed. For example, the encapsulation film TFE may include a plurality of organic material and a plurality of inorganic material layers which are alternately stacked.

A first sensing electrode layer ISM1 may be positioned on the encapsulation film TFE. According to an embodiment, an additional buffer film may be positioned between the first sensing electrode layer ISM1 and the encapsulation film TFE. The first sensing electrode layer ISM1 may be formed of a metal film such as Ag, Mg, Al, Pt, Pd, Au, Ni, Nd, Ir or Cr, a transparent conductive film such as indium tin oxide ("ITO"), indium zinc oxide ("IZO"), zinc oxide ("ZnO"), indium tin zinc oxide ("ITZO"), and/or the like.

The first sensing insulating film ISI1 may be present on the first sensing electrode layer ISM1. The first sensing insulating film ISI1 may be an inorganic insulating film formed of an inorganic material. An inorganic insulating material such as polysiloxane, silicon nitride, silicon oxide, silicon oxynitride, and the like may be used for the first sensing insulating film ISI1.

A second sensing electrode layer ISM2 may be present on the first sensing insulating film ISI1. The second sensing electrode layer ISM2 may be formed of a metal film such as Ag, Mg, Al, Pt, Pd, Au, Ni, Nd, Ir, Cr, a transparent conductive film (such as indium tin oxide ("ITO"), indium zinc oxide ("IZO"), zinc oxide ("ZnO"), or indium tin zinc oxide ("ITZO")), and/or the like.

A configuration of various input sensors using the first sensing electrode layer ISM1, the first sensing insulating film ISI1, and the second sensing electrode layer ISM2 will be described later with reference to FIGS. 17-19.

In the embodiment of FIG. 5, the second sensing electrode layer ISM2 may be patterned to form a first pattern IST1a of the first sensing wire IST1.

The second sensing insulating film ISI2 may be positioned on the second sensing electrode layer ISM2. The second sensing insulating film ISI2 may be configured of an organic film. For example, as the organic insulating material, an organic insulating material such as a polyacrylic compound, a polyimide compound, a fluorocarbon compound such as Teflon, or a benzocyclobutene compound may be used. For example, the second sensing insulating film ISI2 may be configured of polymethyl methacrylate, polydimethylsiloxane, polyimide, acrylate, polyethylene terephthalate, polyethylene naphthalate, and/or the like.

Next, the non-display area NDA, the first additional area ADA1, and the second additional area ADA2 will be described. Because distinction between the non-display area NDA and the first additional area ADA1 is not a characteristic in the cross-sectional view of FIG. 5, the non-display area NDA and the first additional area ADA1 are not separately described. Hereinafter, in describing the non-display area NDA and the second additional area ADA2, description thereof will be omitted or briefly described in order to avoid repetition of description.

The dam DAM may be positioned at a boundary of the second encapsulation film ENC2. For example, the dam DAM may be positioned between a planarization film FLT and the second encapsulation film ENC2. The dam DAM may be a multilayer structure and may include, for example, a first dam DAM1 and a second dam DAM2. For example, the first and second dams DAM1 and DAM2 may be formed of an organic material. The first and second dams DAM1 and DAM2 may correspond to any one of the first via film VIA1, the second via film VIA2, and the pixel definition film PDL. For example, when the first dam DAM1 is configured of the same material through the same process as the first via film VIA1, the second dam DAM2 may be configured of the same material through the same process as the second via film VIA2 or the pixel definition film PDL. In another example, when the first dam DAM1 is configured of the same material through the same process as the second via film VIA2, the second dam DAM2 may be configured of the same material through the same process as the pixel definition film. In addition, when a spacer is formed on the pixel definition layer PDL of the display area DA, the dam DAM may also be configured using the same material as the spacer.

The dam DAM substantially prevents or prevents the organic material of the second encapsulation film ENC2 of which fluidity is high from overflowing to the outside of the dam DAM during a process (e.g., formation process). The first and third encapsulation films ENC1 and ENC3 configured of the inorganic material may cover the dam DAM and extend, and thus adhesion to the substrate SUB or other films on the substrate SUB may be increased.

The first pad PDE1 may be positioned on the substrate SUB, and may be spaced apart from the planarization film FLT. The first pad PDE1 may be supported by a second insulating layer group ING2. Insulating films of the second insulating film group ING2 may correspond to the insulating films of the first insulating film group ING1. The first pad PDE1 may include a first pad electrode PDE1a and a second pad electrode PDE1b. The first pad electrode PDE1a may be configured of the same material as the first connection pattern CNP1. The second pad electrode PDE1b may be configured of the same material as the second connection pattern CNP2.

The planarization film FLT may be positioned on the substrate SUB, and may be spaced apart from the area covered by the encapsulation film TFE. The planarization film FLT may be an organic insulating film formed of an organic material. An organic insulating material (such as a polyacrylic compound, a polyimide compound, a fluorocarbon compound such as Teflon, a benzocyclobutene compound, and/or the like) may be used for the planarization film FLT.

In the present embodiment, the planarization film FLT may be formed before the formation of the first connection pattern CNP1 after the formation of the interlayer insulating film ILD. Therefore, the planarization film FLT and the first via film VIA1 may be formed through different processes. According to an embodiment, the planarization film FLT and the first via film VIA1 may include different organic materials.

One end of the planarization film FLT may cover the first insulating film group ING1. In addition, a portion of the planarization film FLT corresponding to the second bending area BA2 may fill a first trench TCH1 between the first insulating film group ING1 and the second insulating film group ING2.

Because the inorganic insulating films have a higher rigidity and a lower flexibility than the organic insulating film, a probability of a crack occurring is relatively high. When the crack occurs in the inorganic insulating films, the crack may propagate to wires on the inorganic insulating films, and result in a defect of a wire, a disconnection or the like.

Therefore, as shown in FIG. 5, the first trench TCH1 may be formed by removing the inorganic insulating films from the second bending area BA2, and the first insulating film group ING1 and the second insulating film group ING2 may be distinguished. In the present embodiment, all of the inorganic insulating films corresponding to an area of the first trench TCH1 are removed, but in one or more embodiments, some inorganic insulating films may be remained. In this case, the remaining inorganic insulating films may include a slit to disperse a bending stress.

A second pattern IST1b of the first sensing wire IST1 may extend on the planarization film FLT and may be electrically connected to the first pad PDE1. In the present embodiment, the second pattern IST1b may be configured of the same material through the same process as the first connection pattern CNP1.

A first wire protective film LPL1 may cover the planarization film FLT and the second pattern IST1b. In addition, a second wire protective film LPL2 may cover the first wire protective film LPL1. According to an embodiment, a configuration of the second wire protective film LPL2 may be omitted. The first and second wire protective films LPL1 and LPL2 may be formed of an organic material. The first and second wire protective films LPL1 and LPL2 may correspond to any one of the first via film VIA1, the second via film VIA2, and the pixel definition film PDL. For example, when the first wire protective film LPL1 is configured of the same material through the same process as the first via film VIA1, the second wire protective film LPL2 may be configured of the same material through the same process as the second via film VIA2 or the pixel definition film PDL. In another example, when the first wire protective film LPL1 is configured of the same material through the same process as the second via film VIA2, the second wire protective film LPL2 may be configured of the same material through the same process as the pixel definition film PDL.

The first and second wire protective films LPL1 and LPL2 and the first sensing insulating film ISI1 may include a first opening portion OPN1 that exposes the second pattern IST1b.

The first pattern IST1a may be connected to the second pattern IST1b through the first opening portion OPN1. According to the present embodiment, a height of the second pattern IST1b (e.g., a first portion of the second pattern IST1b) positioned on one end of the first insulating film group ING1 and the planarization film FLT may be greater than a height of the second pattern IST1b (e.g., a second portion of the second pattern IST1b) positioned on the planarization film FLT corresponding to the first trench TCH1.

Therefore, the first pattern IST1a and the second pattern IST1b may be directly connected with each other without another bridge wire. Because a bridge wire is not present, connection reliability between the first pattern IST1a and the second pattern IST1b is improved. In addition, because a length of the non-display area NDA may be reduced by the length of the bridge wire, dead space is reduced, and a thin bezel is more easily implemented.

A third pattern IST1c of the first sensing wire IST1 may connect the first pad PDE1 and the second pattern ISTb with each other. The third pattern IST1c may be formed of the same material through the same process as the gate electrode GE of the transistor. According to an embodiment, the third pattern IST1c may be formed of the same material through the same process as the upper electrode UE. According to an embodiment, odd-numbered third pattern IST1c may be formed of the same material through the same process as the gate electrode GE of the transistor, and even-numbered third pattern IST1c may be formed of the same material through the same process as the upper electrode UE. In one or more embodiments, the even-numbered third pattern IST1c may be formed of the same material through the same process as the gate electrode GE of the transistor and the odd-numbered third pattern IST1c may be formed of the same material through the same process as the upper electrode UE. Therefore, a short circuit between adjacent wires may be more efficiently prevented or the risk of a short circuit may be reduced.

The second insulating layer group ING2 may include a second opening portion OPN2 that exposes the third pattern IST1c. In addition, the planarization film FLT may include an opening portion corresponding to the second opening portion OPN2. The second pattern IST1b may be connected to the third pattern IST1c through the second opening portion OPN2.

Figure 6:
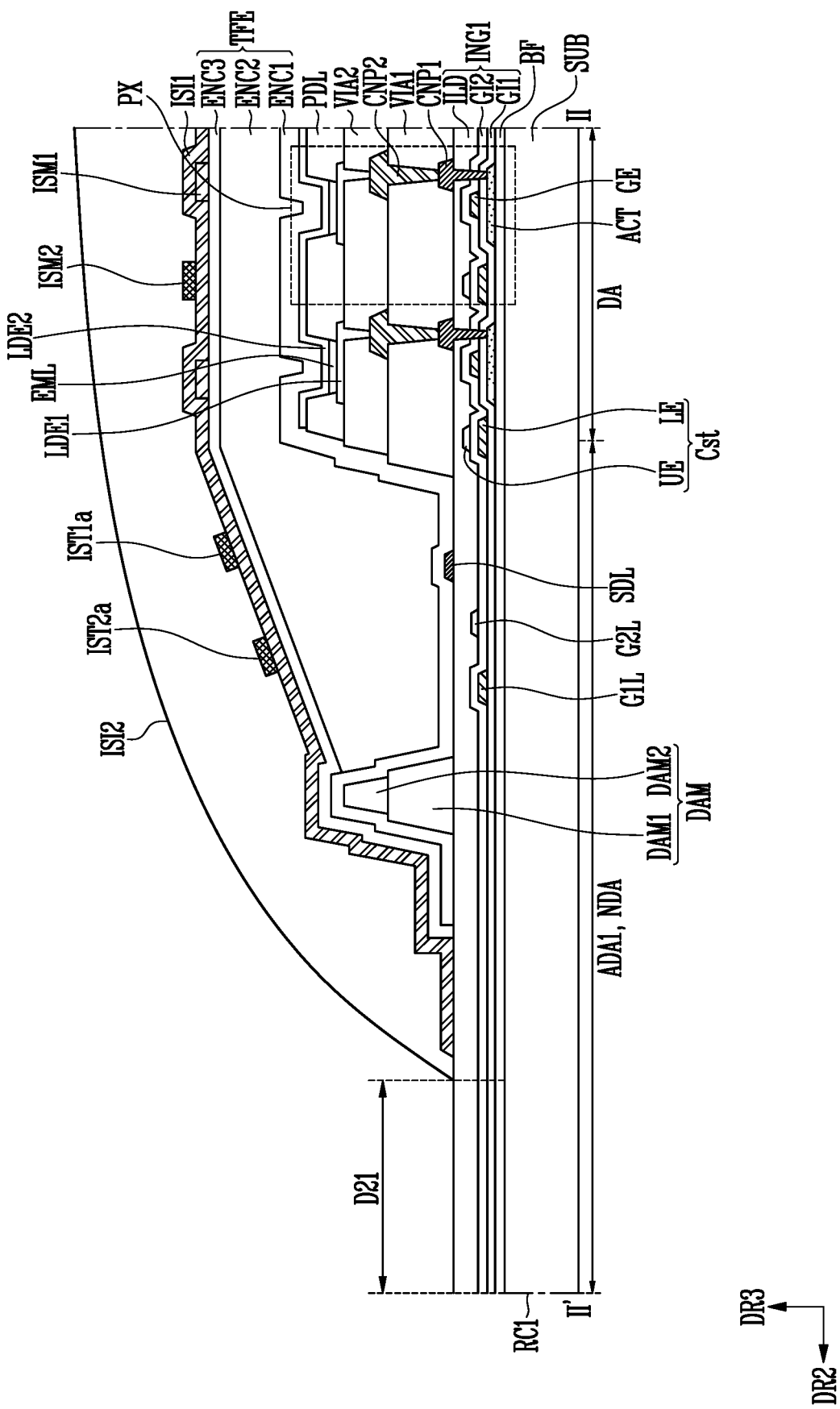
FIGS. 6-8 are cross-sections taken along a line II-II' of FIG. 2.
Figure 7:
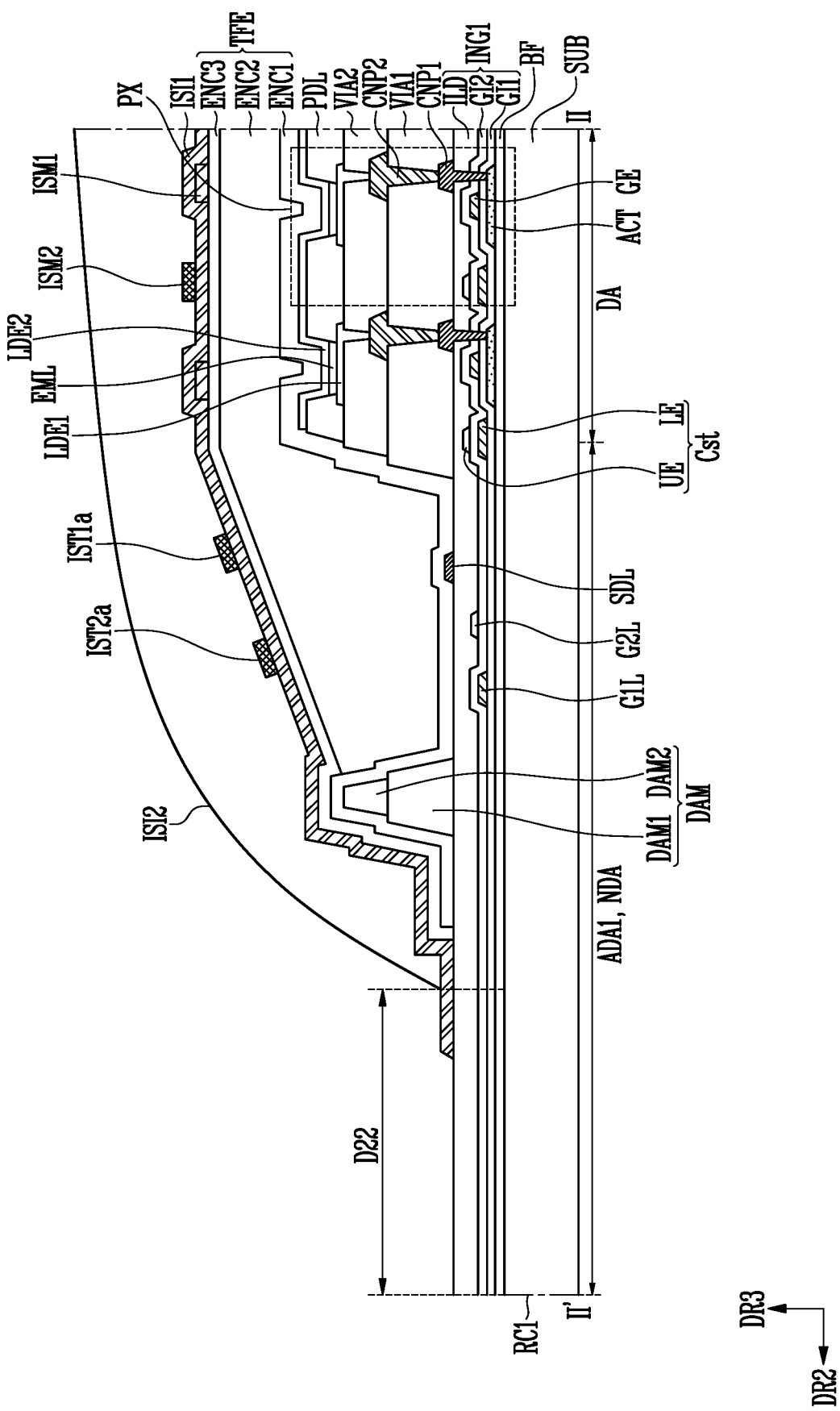
Figure 8:
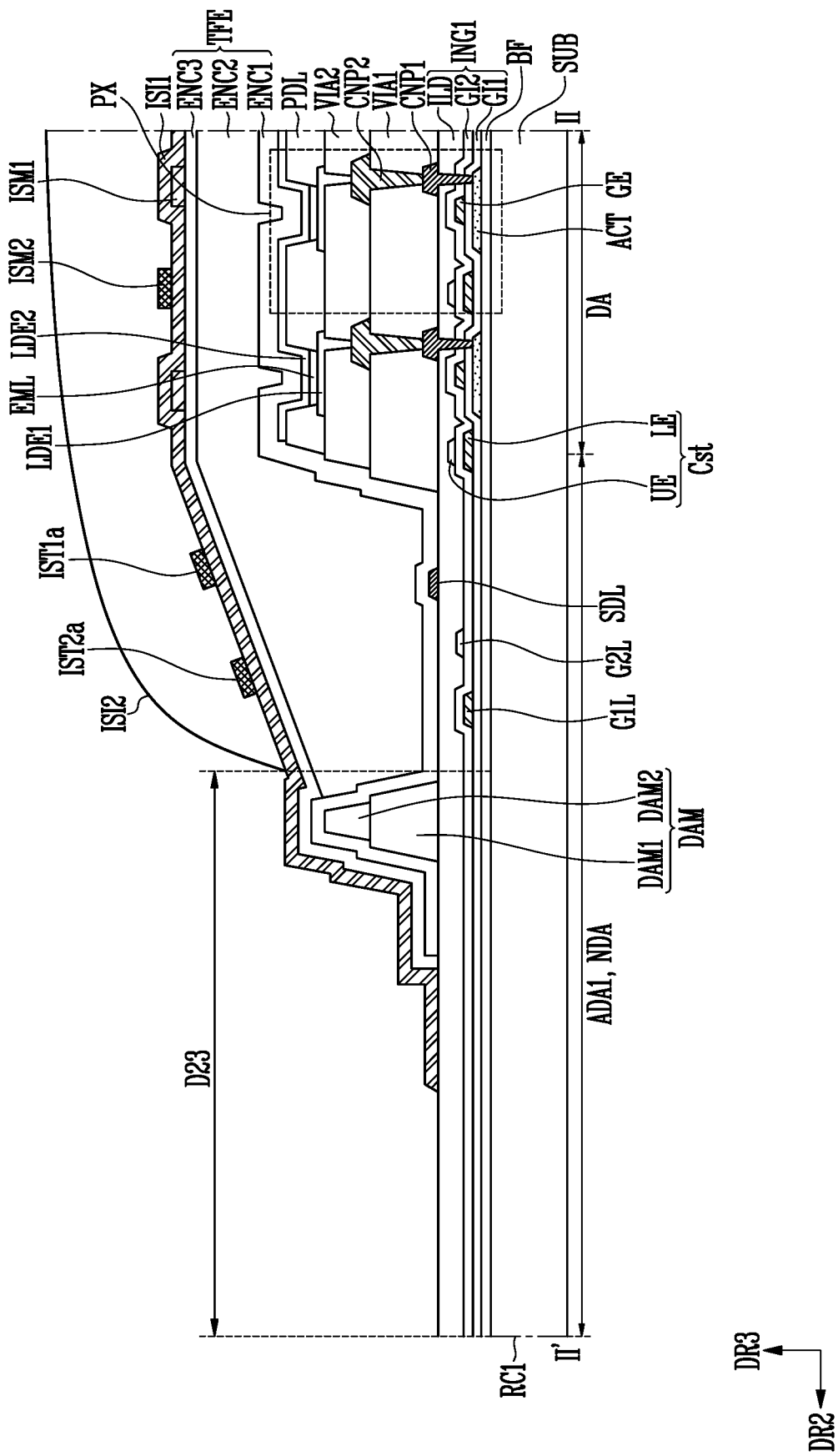

FIGS. 6-8 are cross-sections taken along a line II-II' of FIG. 2.

The line II-II' of FIG. 2 may correspond to the first bending axis BX1. However, the same embodiment may be applied to the second side RC2 as well as the first side RC1.

The display wires DST may be configured of a single-layer wire or a multilayer wire using at least one of the wires G1L, G2L, and SDL. The wire G1L may be configured of the same material through the same process as the gate electrode GE. The wire G2L may be configured of the same material through the same process as the upper electrode UE. The wire SDL may be configured of the same material through the same process as the first connection pattern CNP1.

The patterns IST1a and IST12a of the sensing wires IST1 and IST2 may be positioned on the encapsulation film TFE and the first sensing insulating film ISI1 (in the third direction DR3) and may be positioned between the dam DAM and the display area DA (in the second direction DR2). The first sensing insulating film ISI1 may be positioned between the encapsulation film TFE and the sensing wires IST1 and IST2.

In the embodiment of FIG. 6, the second sensing insulating film ISI2 covers the first sensing insulating film ISI1. Therefore, the non-cover area NCA is not present in contrast to the embodiment shown in FIG. 3.

In this case, because a distance D21 from the first side RC1 is not sufficiently secured, a large stress may be applied to the second sensing insulating film ISI2 at the time of bending the first bending area BA1, and a crack may occur in the second sensing insulating film ISI2.

In the embodiment of FIG. 7, a portion of the first sensing insulating film ISI1 is not covered by the second sensing insulating film ISI2. Therefore, the non-cover area NCA is present similar to the embodiment of FIG. 3.

In this case, because a distance D22 from the first side RC1 is sufficiently secured, the stress applied to the second sensing insulating film ISI2 at the time of bending the first bending area BA1 may be relatively small, and a crack may not occur in the sensing insulating film IS12.

In the embodiment of FIG. 7, at least some boundary of the second sensing insulating film ISI2 may be closer to the first side RC1 than the dam DAM.

In the embodiment of FIG. 8, a portion of the first sensing insulating film ISI1 is not covered by the second sensing insulating film ISI2. Therefore, the non-cover area NCA is present similar to the embodiment of FIG. 3.

In this case, because a distance D23 from the first side RC1 is sufficiently secured, the stress applied to the second sensing insulating film ISI2 at the time of bending the first bending area BA1 may be smaller than that of FIG. 7, and a crack may not occur in the second sensing insulating film ISI2.

In the embodiment of FIG. 8, at least some boundary of the second sensing insulating film ISI2 may be farther from the first side RC1 than the dam DAM. In addition, at least some boundary of the second sensing insulating film ISI2 may be closer to the first side RC1 than the patterns IST1$a$ and IST2$a$ of the sensing wires IST1 and IST2. Therefore, the second sensing insulating film ISI2 may cover the patterns IST1$a$ and IST2$a$ of the sensing wires IST1 and IST2, and thus the patterns IST1$a$ and IST2$a$ may be protected.

Figure 9:
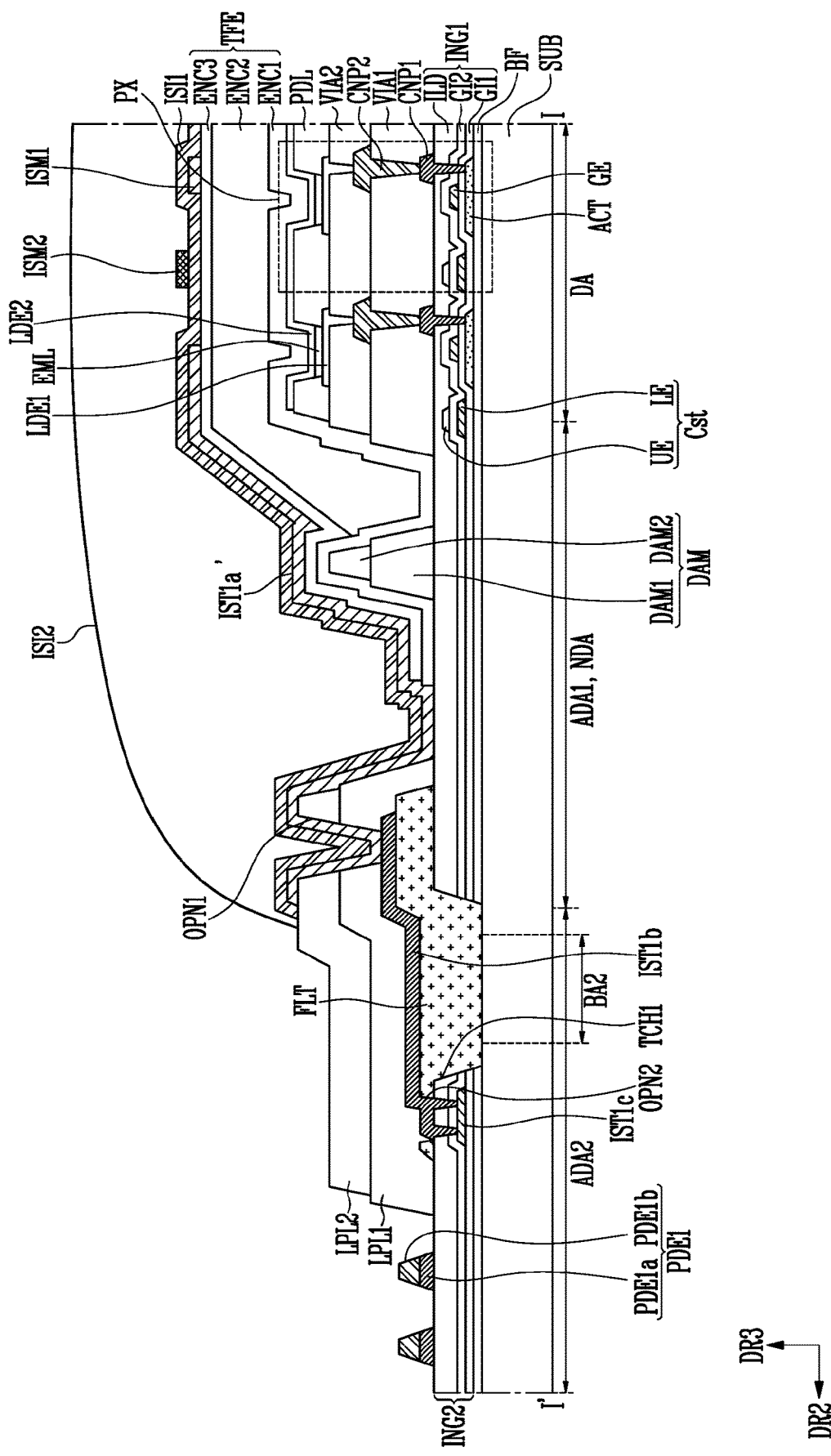
FIG. 9 is an embodiment of the cross-section taken along the line I-I' of FIG. 2.

FIG. 9 is an embodiment of the cross-section taken along the line I-I' of FIG. 2.

In the embodiment of FIG. 9, in contrast to the embodiment of FIG. 5, the first sensing electrode layer ISM1 may be patterned to form a first pattern IST1$a'$ of the first sensing wire IST1.

The first and second wire protective films LPL1 and LPL2 may include a first opening portion OPN1. In contrast to the embodiment of FIG. 5, the first sensing insulating film ISI1 does not include the first opening portion OPN1. The first pattern IST1$a'$ may be connected to the second pattern IST1$b$ through the first opening portion OPN1. The first sensing insulating film ISI1 may cover the first pattern IST1$a'$.

Description of other configurations redundant to those in FIG. 5 will be omitted.

Figure 10:
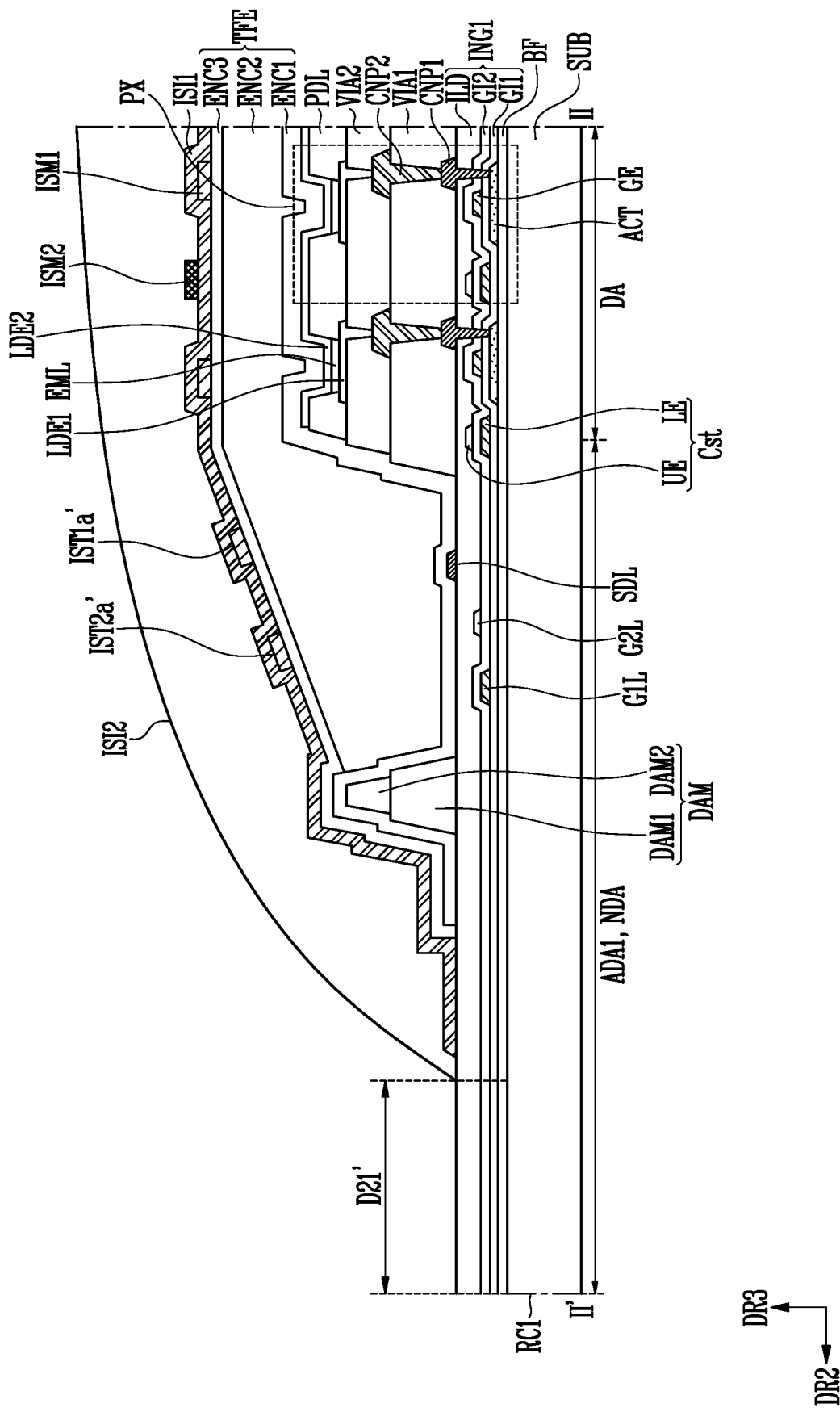
FIGS. 10-12 are embodiments of the cross section taken along the line II-II' of FIG. 2.
Figure 11:
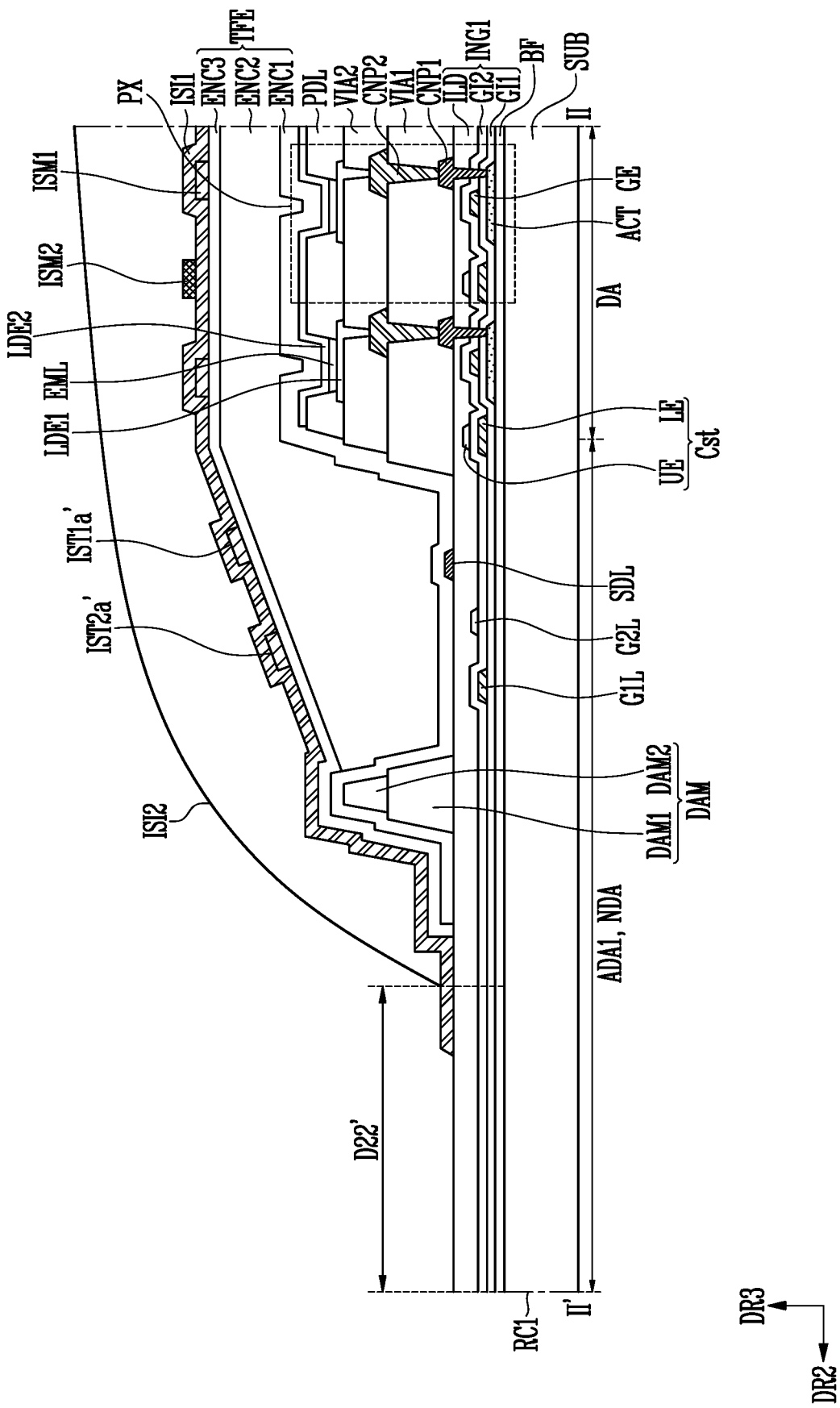
Figure 12:
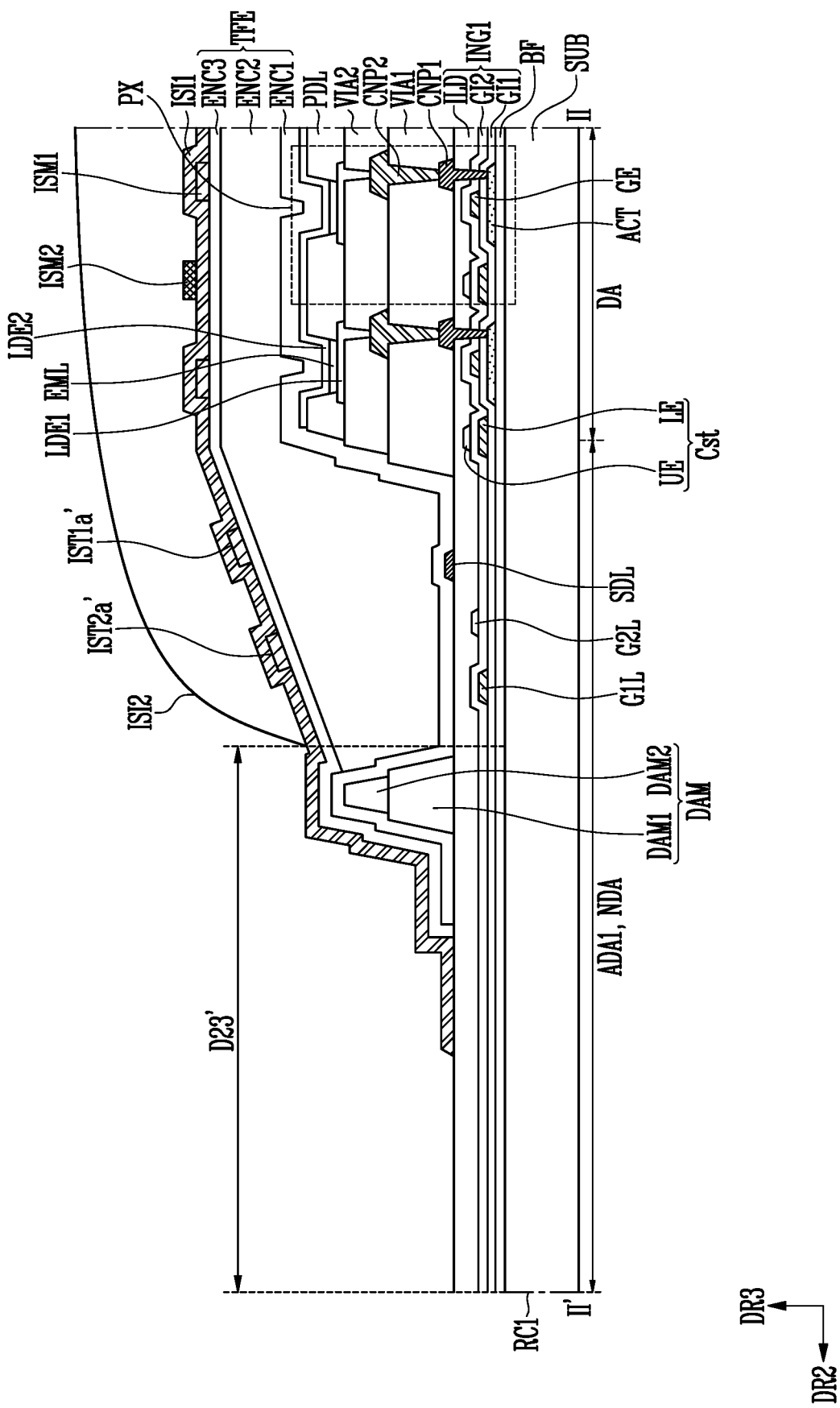

FIGS. 10-12 are embodiments of the cross section taken along the line II-II' of FIG. 2.

The line II-II' of FIG. 2 may correspond to the first bending axis BX1. However, the same embodiment may be applied to the second side RC2 as well as the first side RC1.

The display wires DST may be configured of a single-layer wire or a multilayer wire using at least one of the wires G1L, G2L, and SDL. The wire G1L may be configured of the same material through the same process as the gate electrode GE. The wire G2L may be configured of the same material through the same process as the upper electrode UE. The wire SDL may be configured of the same material through the same process as the first connection pattern CNP1.

The patterns IST1$a'$ and IST2$a'$ of the sensing wires IST1 and IST2 may be positioned between the encapsulation film TFE and the first sensing insulating film ISI1 (in the third direction DR3) and may be positioned between the dam DAM and the display area DA (in the second direction DR2). The first sensing insulating film ISI1 may be positioned between the sensing wires IST1 and IST2 and the second sensing insulating film IS12.

In the embodiment of FIG. 10, the second sensing insulating film ISI2 covers the first sensing insulating film ISI1. Therefore, the non-cover area NCA is not present in contrast to the embodiment of FIG. 3.

In this case, because a distance D21' from the first side RC1 is not sufficiently secured, a large stress may be applied to the second sensing insulating film ISI2 at the time of bending the first bending area, and a crack may occur in the second sensing insulating film ISI2.

In the embodiment of FIG. 11, a portion of the first sensing insulating film ISI1 is not covered by the second sensing insulating film IS12. Therefore, the non-cover area NCA is present similar to the embodiment of FIG. 3.

In this case, because a distance D22' from the first side RC1 is sufficiently secured, the stress applied to the second sensing insulating film ISI2 at the time of bending the first bending area BA1 may be relatively small, and a crack may not occur in the second sensing insulating film ISI2.

In the embodiment of FIG. 11, at least some boundary of the second sensing insulating film ISI2 may be closer to the first side RC1 than the dam DAM.

In the embodiment of FIG. 12, a portion of the first sensing insulating film ISI1 is not covered by the second sensing insulating film IS12. Therefore, the non-cover area NCA is present similar to the embodiment of FIG. 3.

In this case, because a distance D23' from the first side RC1 is sufficiently secured, the stress applied to the second sensing insulating film ISI2 at the time of bending the first bending area BA1 may be smaller than that of FIG. 11, and a crack may not occur in the second sensing insulating film ISI2.

In the embodiment of FIG. 12, at least some boundary of the second sensing insulating film ISI2 may be farther from the first side RC1 than the dam DAM. In addition, at least some boundary of the second sensing insulating film ISI2 may be closer to the first side RC1 than the patterns IST1$a'$ and IST2$a'$ of the sensing wires IST1 and IST2. Therefore, the second sensing insulating film ISI2 may cover the patterns IST1$a'$ and IST2$a'$ of the sensing wires IST1 and IST2, and thus the patterns IST1$a'$ and IST2$a'$ may be protected.

FIGS. 13-16 are embodiments of the cross section taken along the line I-I' of FIG. 2.

Figure 13:
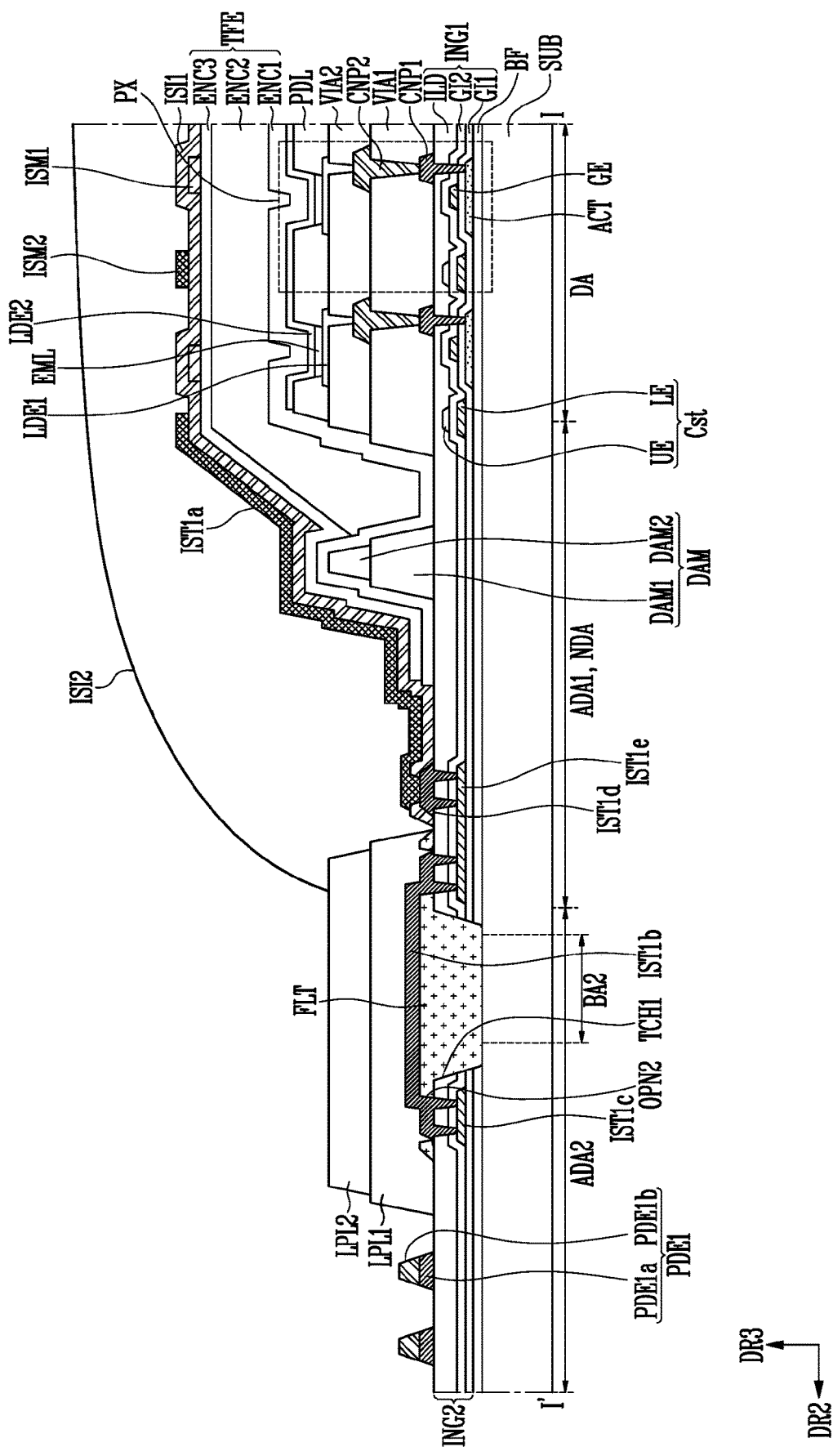
FIGS. 13-16 are embodiments of the cross section taken along the line I-I' of FIG. 2.

Referring to FIG. 13, in comparison with FIG. 5, the first pattern IST1$a$ of the first sensing wire IST1 is not directly connected to the second pattern IST1$b$.

The first sensing wire IST1 of the embodiment of FIG. 13 may further include a fourth pattern IST1$d$ and a fifth pattern IST1$e$. The fourth pattern IST1$d$ may be formed of the same material through the same process as the first connection pattern CNP1. The fifth pattern IST1$e$ may be formed of the same material through the same process as the gate electrode GE.

The first pattern IST1$a$ may be connected to the fourth pattern IST1$d$ through an opening portion of the first sensing insulating film ISI1. In addition, the fourth pattern IST1$d$ may be connected to the fifth pattern IST1$e$ through opening portions of the interlayer insulating film ILD and the second gate insulating film GI2. The existing second pattern IST1$b$ may be connected to the fifth pattern IST1$e$ through the opening portions of the interlayer insulating film ILD and the second gate insulating film GI2. That is, in the embodiment of FIG. 13, the fifth pattern IST1$e$ is used as a bridge wire. In this case, a step difference due to an organic film may be minimized or reduced, and thus a disconnection probability of the first sensing wire IST1 may be reduced.

In one or more embodiments, the first via film VIA1 may be present under an end portion (or boundary) of the encapsulation film TFE. In one or more embodiments, the first via film VIA1 may be extended to cover the fourth pattern IST1$d$. In this case, the first pattern IST1$a$ may be connected to the fourth pattern IST1*d* through opening portions of the first sensing insulating film ISI1 and the first via film VIA1.

Figure 14:
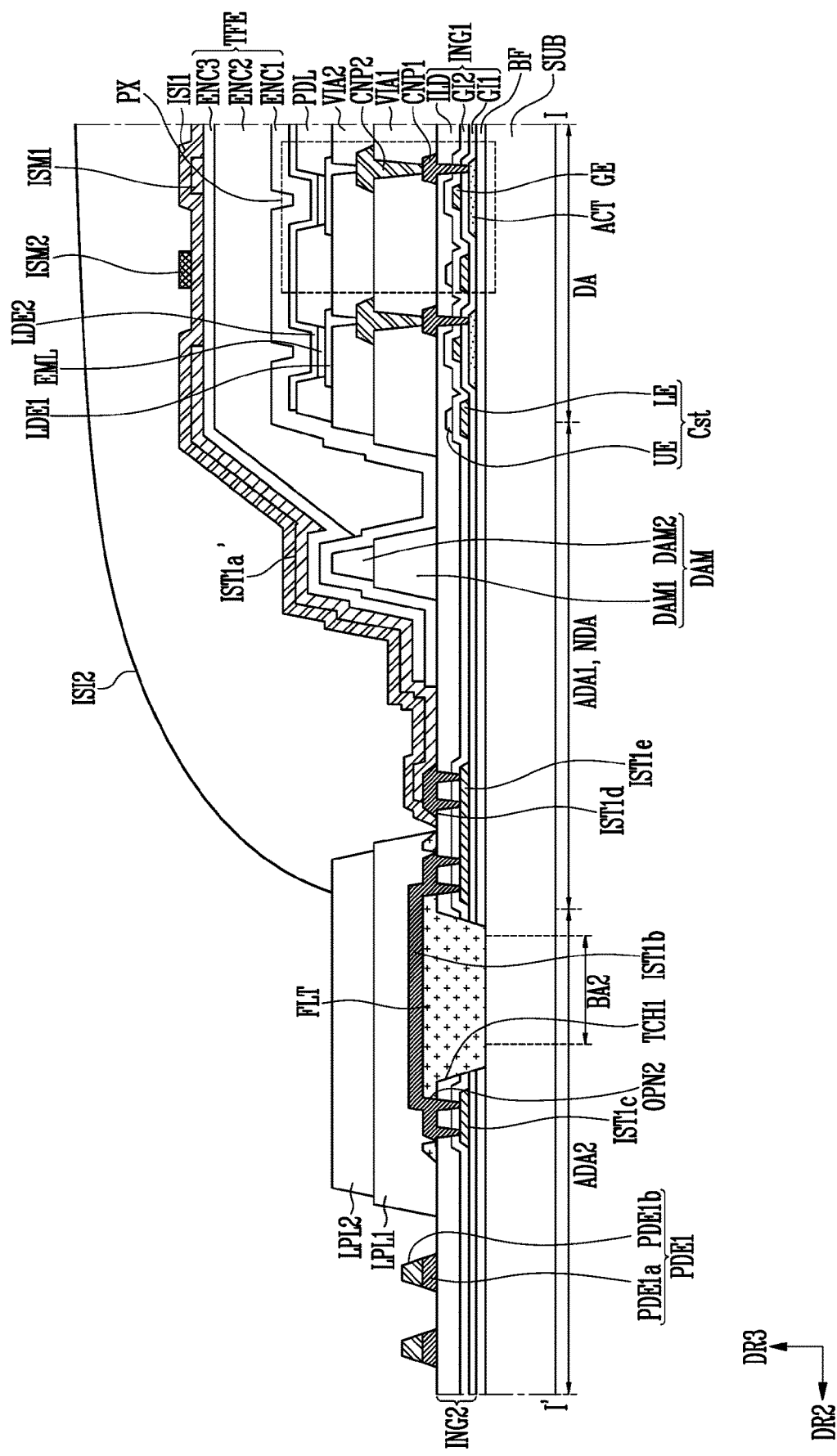

The embodiment of FIG. 14 is different from the embodiment of FIG. 13 in that the first pattern IST1*a'* of the first sensing wire IST1 is configured as the first sensing electrode layer ISM1. In this case, the first sensing insulating film ISI1 does not include an opening portion on the fourth pattern IST1*d*. Descriptions of the remaining configurations redundant to those of FIG. 13 will be omitted.

Figure 15:
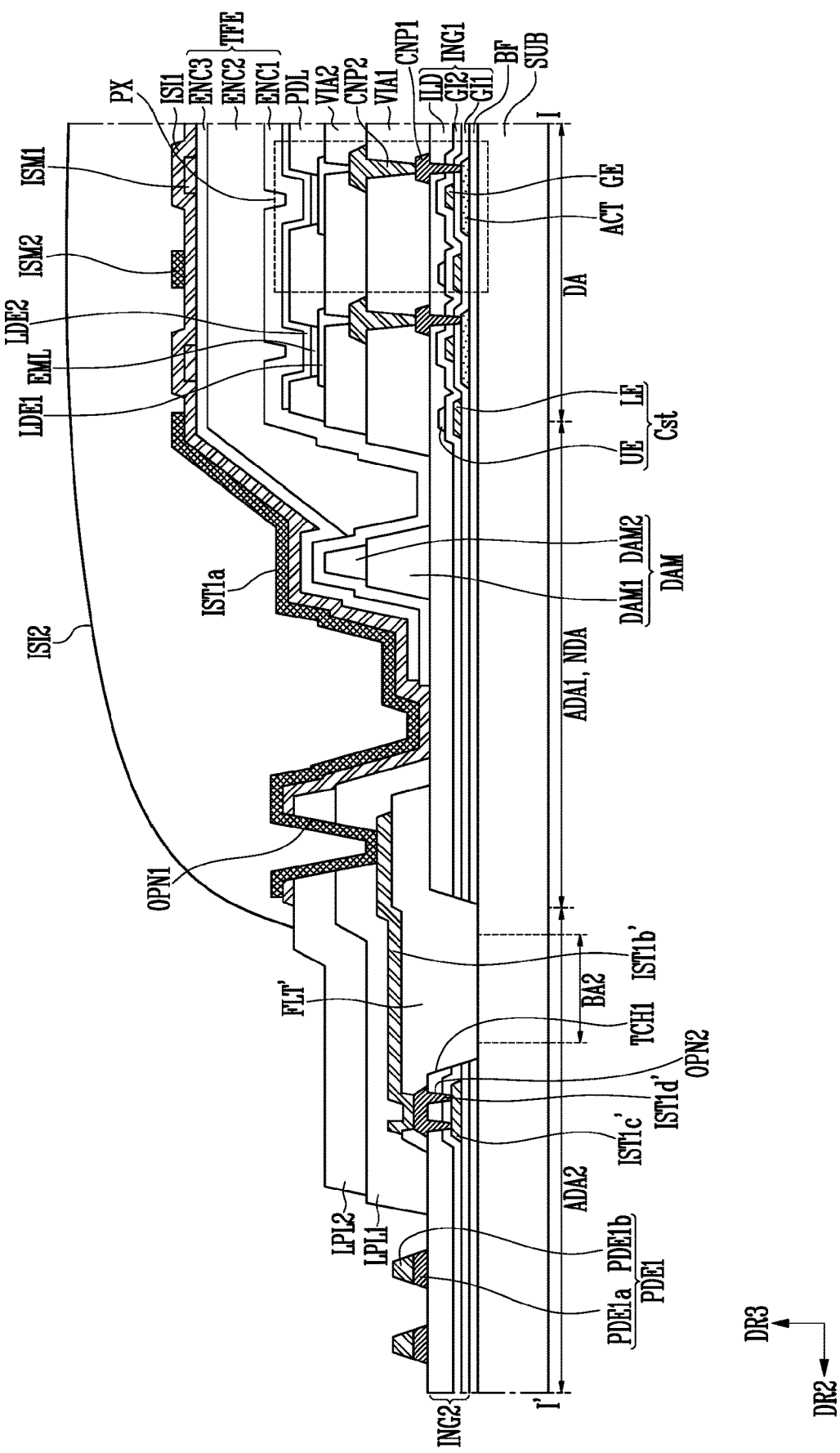

In the embodiment of FIG. 15, a planarization film FLT' may be configured of the same material through the same process as the first via film VIA1, in contrast to the embodiment of FIG. 5. In this case, a mask for forming the planarization film FLT of FIG. 5 may be omitted. Therefore, a process cost may be reduced.

In the embodiment of FIG. 15, a second pattern IST1*b'* may be formed of the same material through the same process as the second connection pattern CNP2.

The embodiment of FIG. 15 may further include a fourth pattern IST1*d'* connecting a third pattern IST1*c'* and the second pattern IST1*b'*, in contrast to the embodiment of FIG. 5. A second opening portion OPN2 of the second insulating film group ING2 may expose the third pattern IST1*c'* and may be covered by a fourth pattern IST1*d'*. The planarization layer FLT' may include an opening portion exposing the fourth patterns IST1*d'* corresponding to the second opening portions OPN2. The fourth pattern IST1*d'* may be configured of the same material as the first connection pattern CNP1.

In the embodiment of FIG. 15, description of other configurations redundant to those of FIG. 5 will be omitted.

Figure 16:
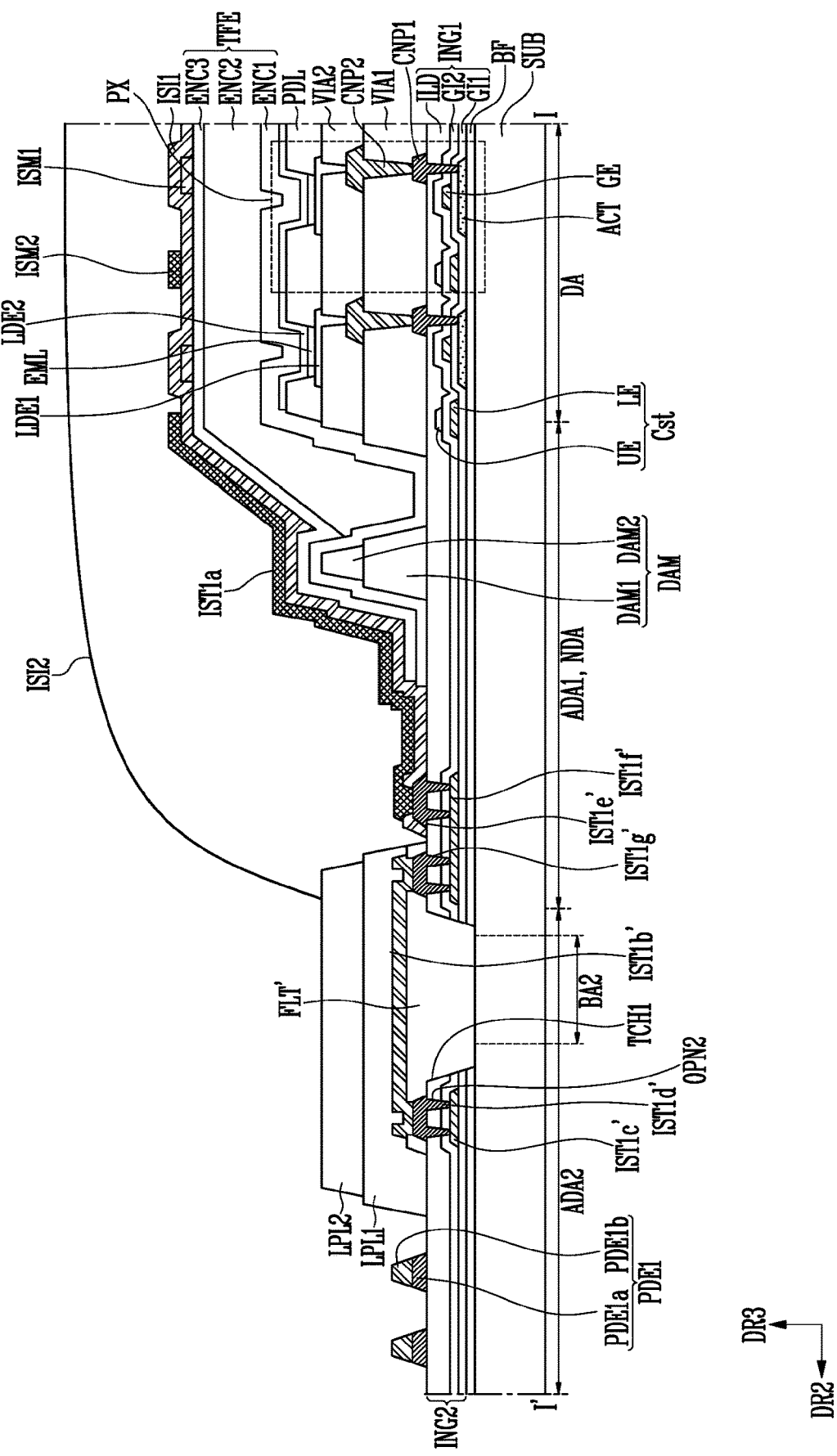

Referring to FIG. 16, in contrast to FIG. 15, the first pattern IST1*a* of the first sensing wire IST1 is not directly connected to the second pattern IST1*b'*.

The first sensing wire IST1 of the embodiment of FIG. 16 may further include a fifth pattern IST1*e'*, a sixth pattern IST1*f'*, and a seventh pattern IST1*g'*. The fifth pattern IST1*e'* and the seventh pattern IST1*g'* may be formed of the same material through the same process as the first connection pattern CNP1. The sixth pattern IST1*f* may be formed of the same material through the same process as the gate electrode GE.

The first pattern IST1*a* may be connected to the fifth pattern IST1*e'* through the opening portion of the first sensing insulating film ISI1. As described above, in one or more embodiments, the first via film VIA1 may be present under the end portion (or boundary) of the encapsulation film TFE. In one or more embodiments, the first via film VIA1 may be extended to cover the fifth pattern IST1*e'*. In this case, the first pattern IST1*a* may be connected to the fifth pattern IST1*e'* through the opening portions of the first sensing insulating film ISI1 and the first via film VIA1.

The fifth pattern IST1*e'* may be connected to the sixth pattern IST1*f* through the opening portions of the interlayer insulating film ILD and the second gate insulating film GI2.

The existing second pattern IST1*b* may be connected to the sixth pattern IST1*f* through the seventh pattern IST1*g'*. That is, in the embodiment of FIG. 16, the sixth pattern IST1*f* is used as a bridge wire. In this case, a step difference due to the organic film may be minimized and reduced, and the disconnection probability of the first sensing wire IST1 may be lowered.

Figure 17:
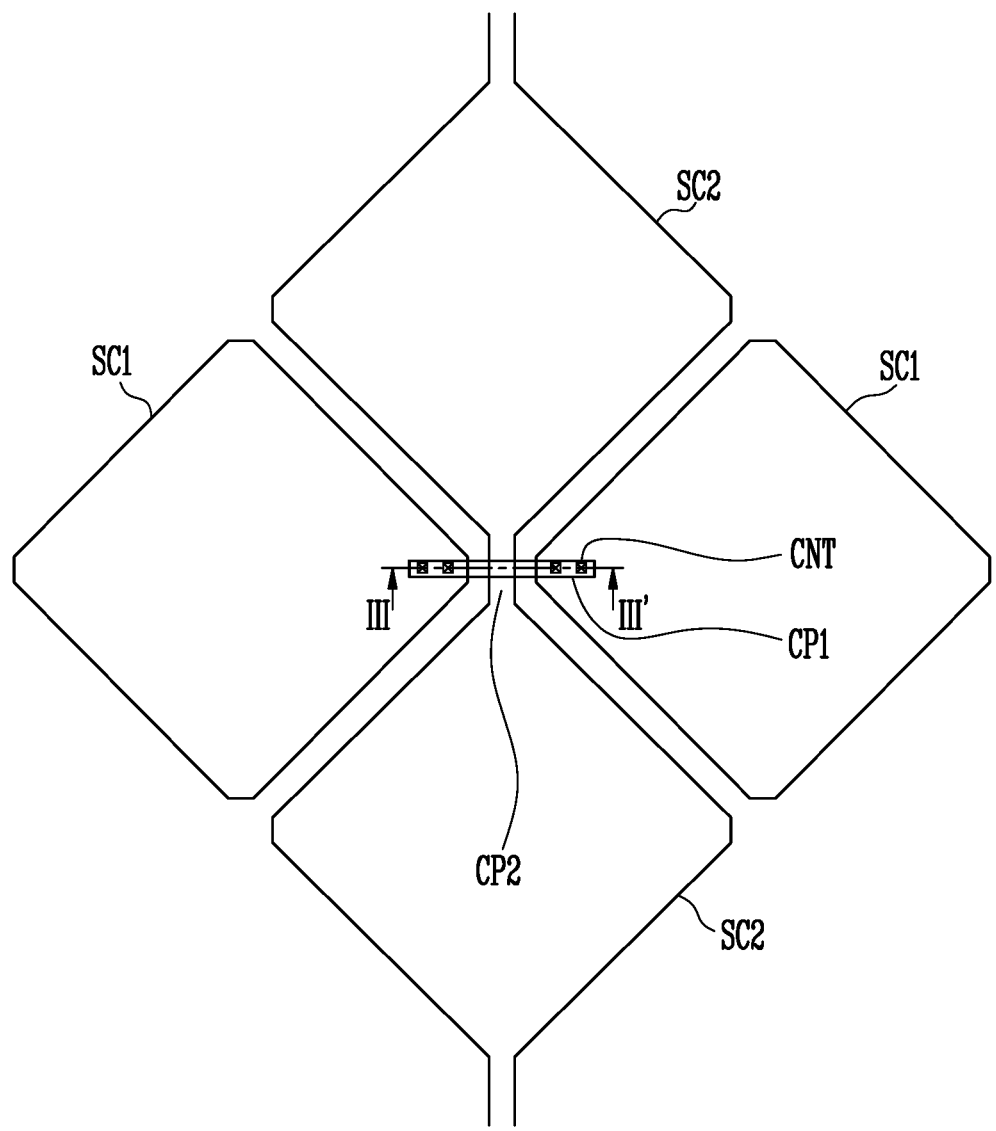
FIGS. 17 and 18 are diagrams for describing sensing electrodes and bridge electrodes according to an embodiment of the disclosure.
Figure 18:
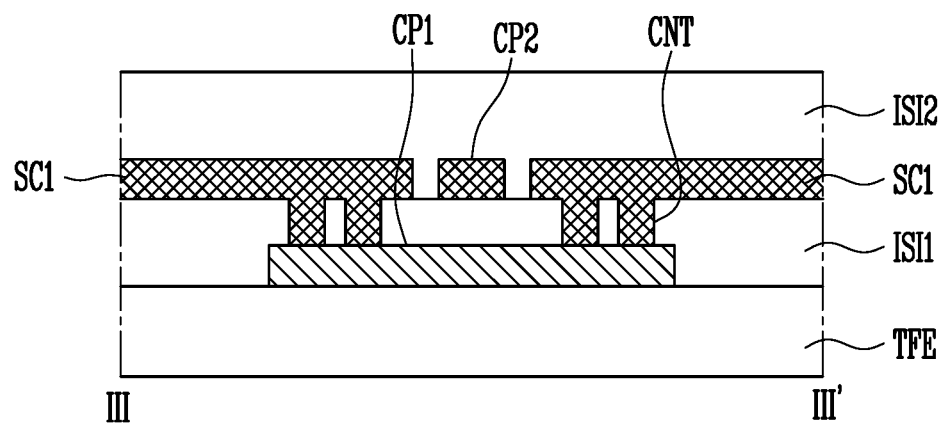

FIGS. 17 and 18 are diagrams for describing sensing electrodes and bridge electrodes according to an embodiment of the disclosure. FIG. 18 is a cross-sectional view taken along a line III-III' of FIG. 17.

The bridge electrodes CP1 may be positioned on the encapsulation film TFE by patterning the first sensing electrode layer ISM1.

The first sensing insulating film ISI1 may cover the bridge electrode CP1 and may include contact holes CNT exposing a part of the bridge electrodes CP1.

The first sensing electrodes SC1 and the second sensing electrodes SC2 may be formed on the first sensing insulating film ISI1 by patterning the second sensing electrode layer ISM2. The first sensing electrodes SC1 may be connected to the bridge electrode CP1 through the contact holes CNT.

The second sensing electrodes SC2 may have a connection pattern CP2 in the same layer by patterning the second sensing electrode layer ISM2. Therefore, in connecting the second sensing electrodes SC2, a separate bridge electrode may be unnecessary.

According to an embodiment, each of the sensing electrodes SC1 and SC2 may cover the plurality of pixels PX. In one or more embodiments, when each of the sensing electrodes SC1 and SC2 is configured as an opaque conductive film, each of the sensing electrodes SC1 and SC2 may include a plurality of opening portions capable of exposing the plurality of covered pixels PX. For example, each of the sensing electrodes SC1 and SC2 may be configured in a mesh shape. When each of the sensing electrodes SC1 and SC2 is configured as a transparent conductive film, each of the sensing electrodes SC1 and SC2 may be configured in a plate form that does not include an opening portion.

Figure 19:
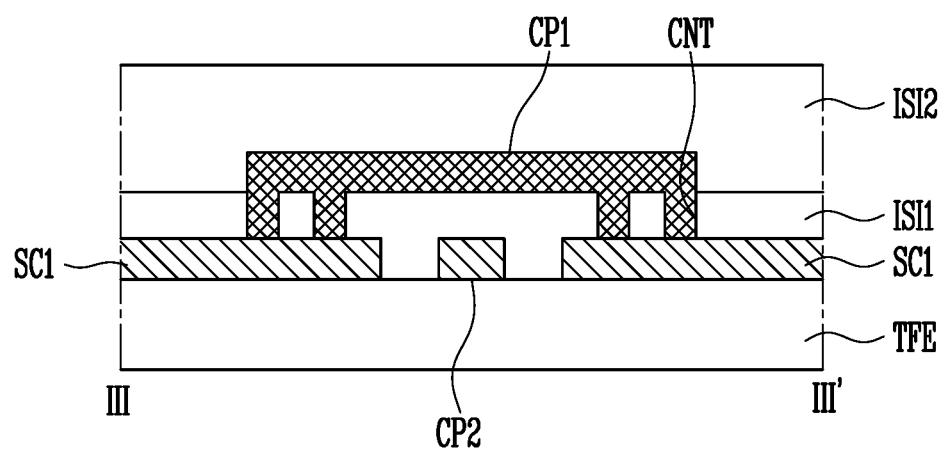
FIG. 19 is a diagram for describing sensing electrodes and bridge electrodes according to an embodiment of the disclosure.

FIG. 19 is a diagram for describing sensing electrodes and bridge electrodes according to an embodiment of the disclosure.

FIG. 19 is another cross-sectional view along the line III-III' of FIG. 17.

The first sensing electrodes SC1 and the second sensing electrodes SC2 may be formed on the encapsulation film TFE by patterning the first sensing electrode layer ISM1.

The first sensing insulating film ISI1 may cover the first sensing electrodes SC1 and the second sensing electrodes SC2 and may include contact holes CNT exposing a portion of the first sensing electrodes SC1.

The bridge electrodes CP1 may be configured on the first sensing insulating film ISI1 by patterning the second sensing electrode layer ISM2. The bridge electrodes CP1 may be connected to the first sensing electrodes SC1 through the contact holes CNT.

Figure 20:
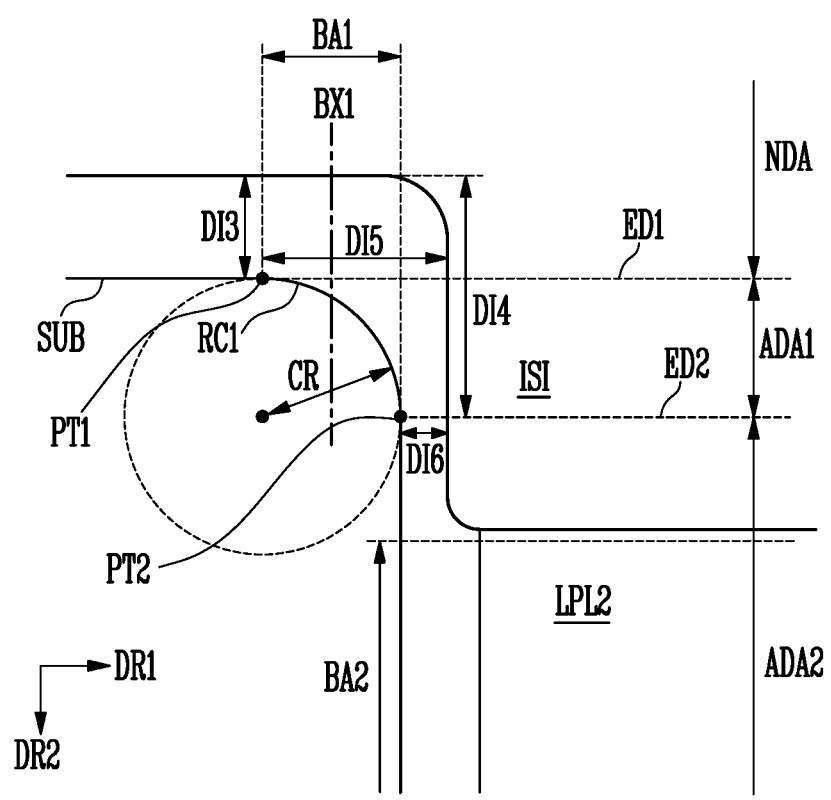
FIG. 20 is an enlarged view of a portion of the first additional area according to an embodiment different from FIG. 3.
Figure 21:
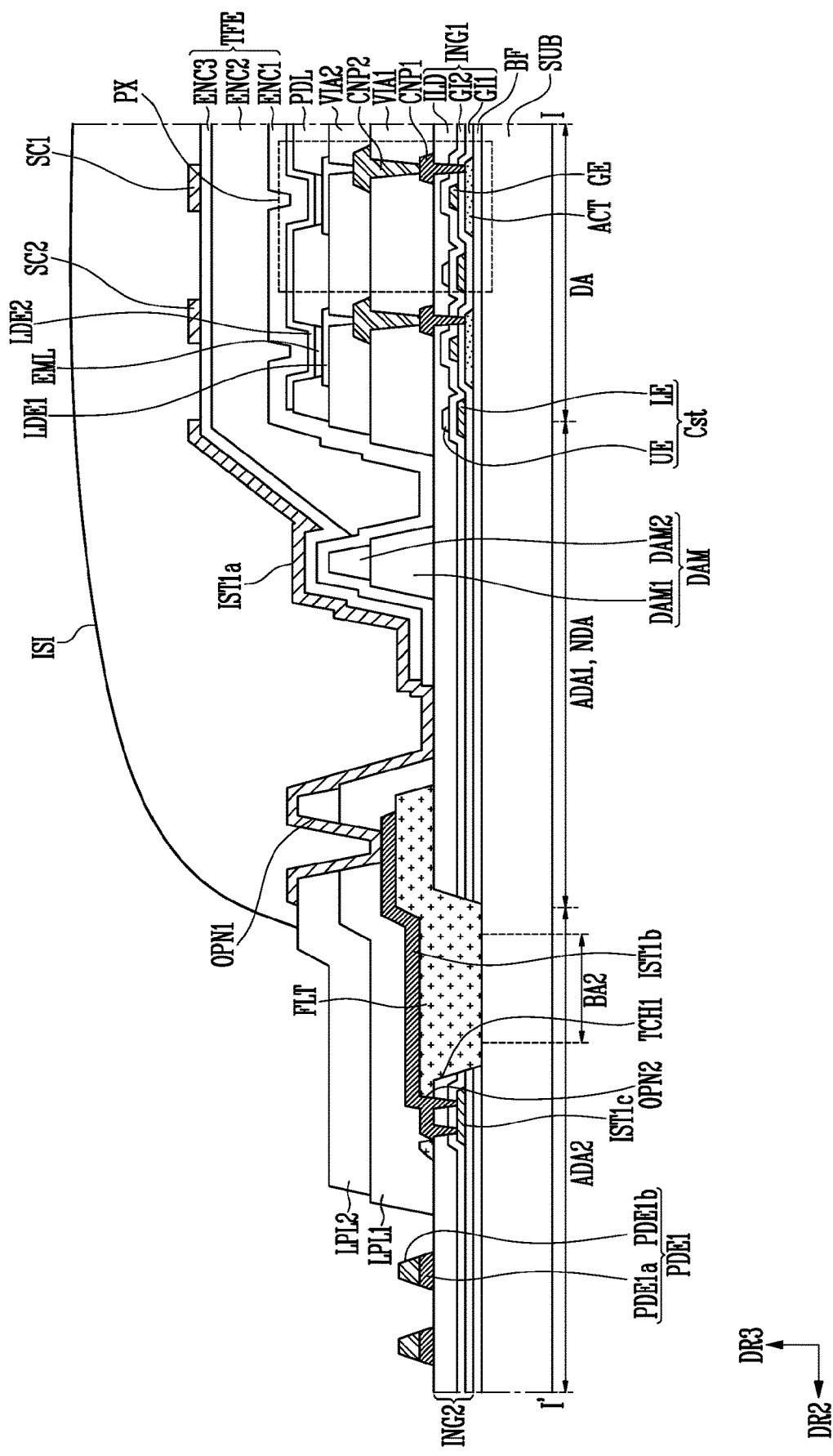
FIG. 21 is an embodiment of a cross section taken along the line I-I' of FIG. 2, in accordance with the embodiment of FIG. 20.
Figure 22:
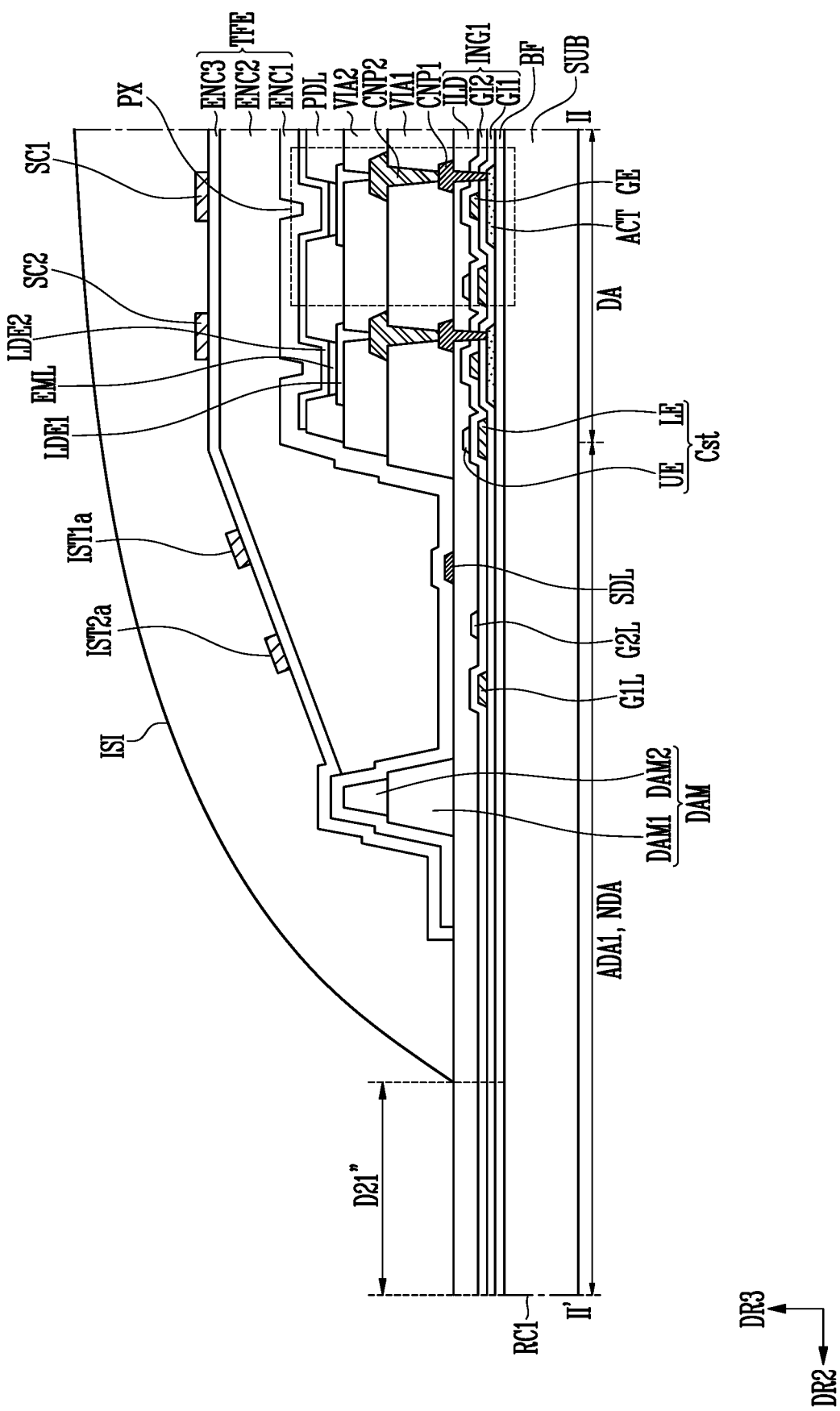
FIGS. 22-24 are embodiments of cross sections taken along the line II-II' of FIG. 2, in accordance with the embodiment of FIG. 20.
Figure 23:
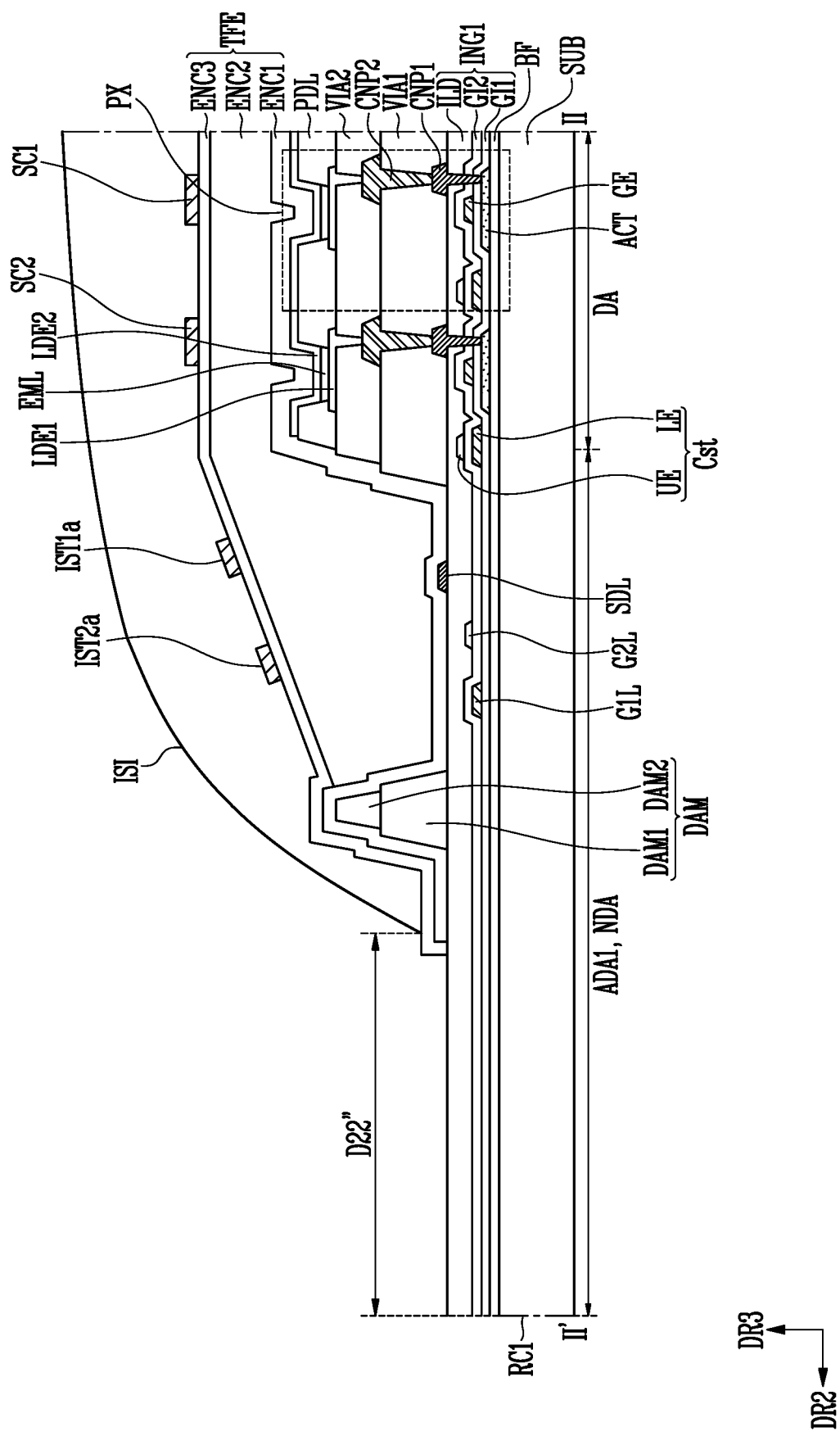
Figure 24:
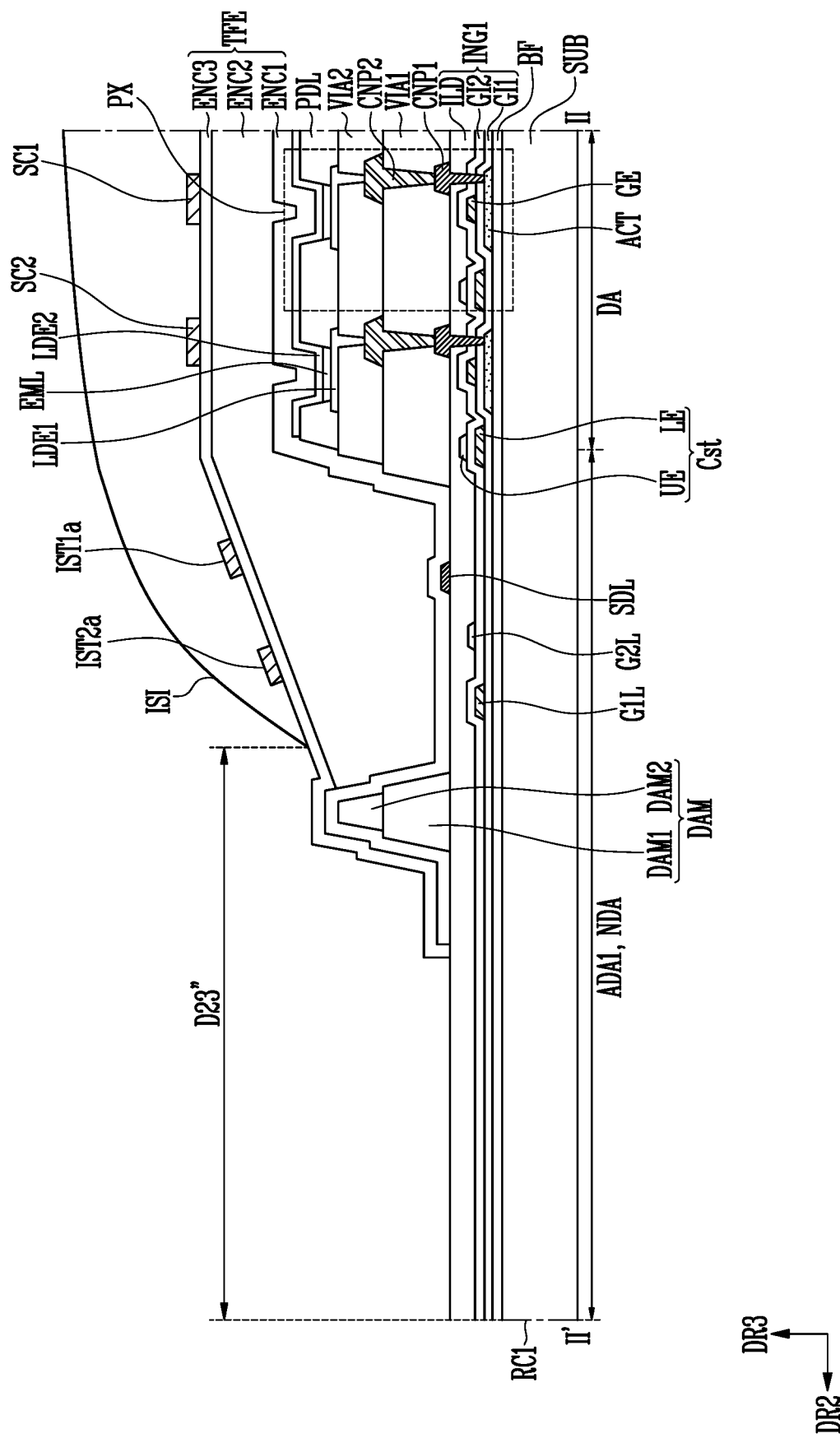

FIG. 20 is an enlarged view of a portion of the first additional area according to an embodiment in contrast to the embodiment of FIG. 3. FIG. 21 is an embodiment of a cross section taken along the line I-I' of FIG. 2, in accordance with the embodiment of FIG. 20. FIGS. 22-24 are embodiments of cross sections taken along the line II-II' of FIG. 2, in accordance with the embodiment of FIG. 20.

A point that crosses (e.g., intersects) the first boundary ED1 of the first side RC1 may be defined as a first point PT1. In addition, a point that crosses (e.g., intersects) the second boundary ED2 of the first side RC1 may be defined as a second point PT2.

The boundary of the sensing insulating film ISI in the first bending area BA1 may be closer to the first side RC1 based on the first point PT1 compared to the first side RC1 based on the second point PT2. That is, the boundary of the sensing insulating film ISI in the first bending area BA1 may be closer to the first side RC1 in the second direction DR2. For example, a distance between the first point PT1 and the boundary of the sensing insulating film ISI may be referred to as a third distance DI3. In addition, a distance between the second point PT2 and the boundary of the sensing insulating film ISI may be referred to as a fourth distance DI4. As shown in FIG. 20, the fourth distance DI4 may be longer than the third distance DI3. Such an arrangement may also be applied to the embodiment of FIG. 3.

In an embodiment, a distance between the first point PT1 and the boundary of the sensing insulating film ISI may be referred to as a fifth distance DI5, with respect to the first boundary ED1. In addition, a distance between the second point PT2 and the boundary of the sensing insulating film ISI may be referred to as a sixth distance DI6, with respect to the second boundary ED2. In one or more embodiments, the fifth distance DI5 may be longer than the sixth distance DI6. Such an arrangement may also be applied to the embodiment of FIG. 3.

According to the embodiment described above, because a separation distance between the boundary of the sensing insulating film ISI and the first side RC1 may be sufficiently secured in the first bending area BA1, even though the substrate SUB is designed so that the radius of curvature CR is reduced, a crack occurrence in the sensing insulating film ISI may be substantially prevented or prevented.

Referring to FIGS. 20-24, in contrast to FIG. 3, the first sensing insulating film ISI1 is not present, and a sensing insulating film ISI corresponding to the second sensing insulating film ISI2 is present. In addition, the second sensing electrode layer ISM2 is not present, and a sensing electrode layer corresponding to the first sensing electrode layer ISM1 is present. The first patterns IST1a and IST2a and the sensing electrodes SC1 and SC2 of the sensing wires IST1 and IST2 may be present as a pattern of the sensing electrode layer.

In the case of FIG. 22, a boundary of the sensing insulating film ISI may be closer to the first side RC1 than the boundary of the encapsulation film TFE. In one or more embodiments, a distance between the boundary of the sensing insulating film ISI and the first side RC1 may correspond to a distance D21".

In the case of FIG. 23, the boundary of the sensing insulating film ISI may be farther from the first side RC1 than the boundary of the encapsulation film TFE. In addition, the boundary of the sensing insulating film ISI may be closer to the first side RC1 than the dam DAM. In one or more embodiments, a distance between the boundary of the sensing insulating film ISI and the first side RC1 may correspond to a distance D22".

In a case of FIG. 24, the boundary of the sensing insulating film ISI may be farther from the first side RC1 than the boundary of the dam DAM. In addition, the boundary of the sensing insulating film ISI may be closer to the first side RC1 than the first patterns IST1a and IST2a. In one or more embodiments, a distance between the boundary of the sensing insulating film ISI and the first side RC1 may correspond to a distance D23".

The distance D23" may be longer than the distance D22". The distance D22" may be longer than the distance D21". As described above, as the distance between the boundary of the sensing insulating film ISI and the first side RC1 is increased, a probability that a crack occurs in the sensing insulating film ISI may be reduced.

Figure 25:
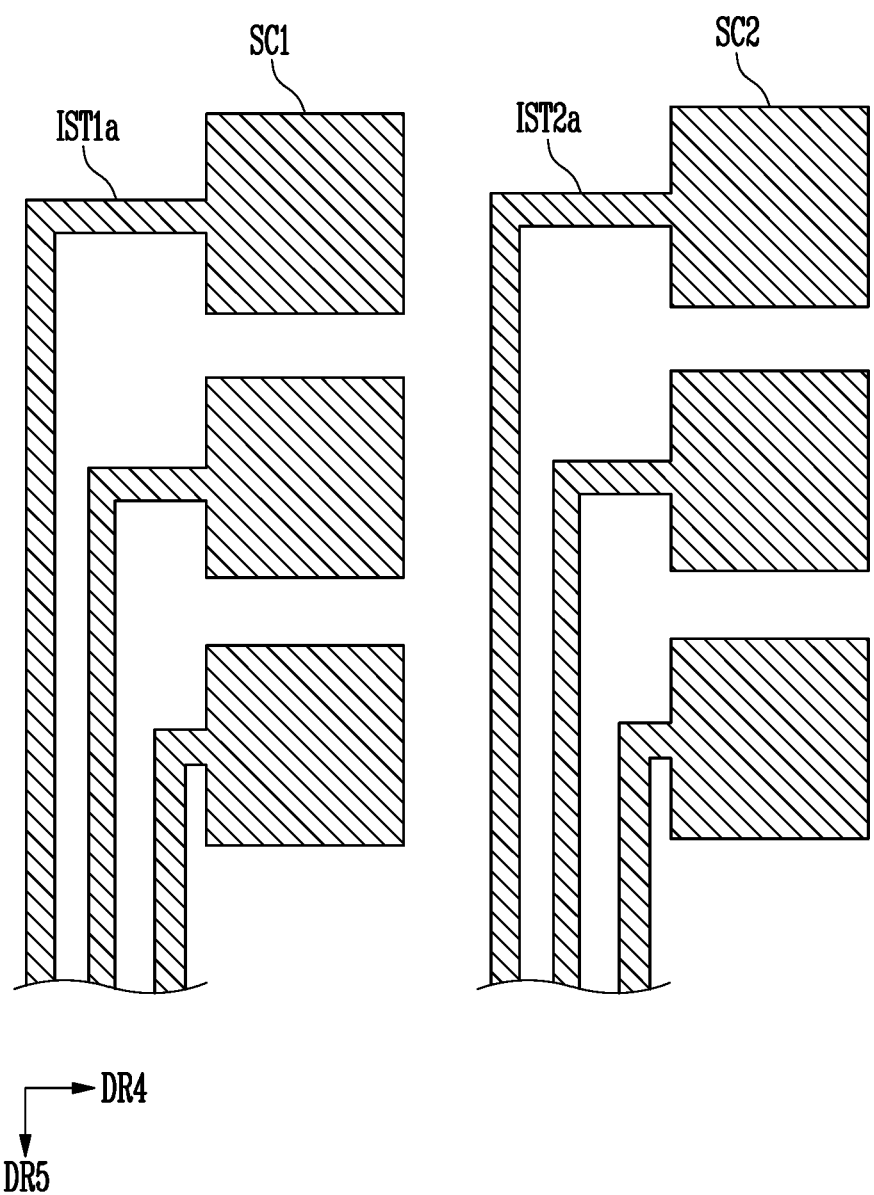
FIGS. 25 and 26 are embodiments of the sense electrodes and the sensing wires in accordance with the embodiment of FIG. 20.
Figure 26:
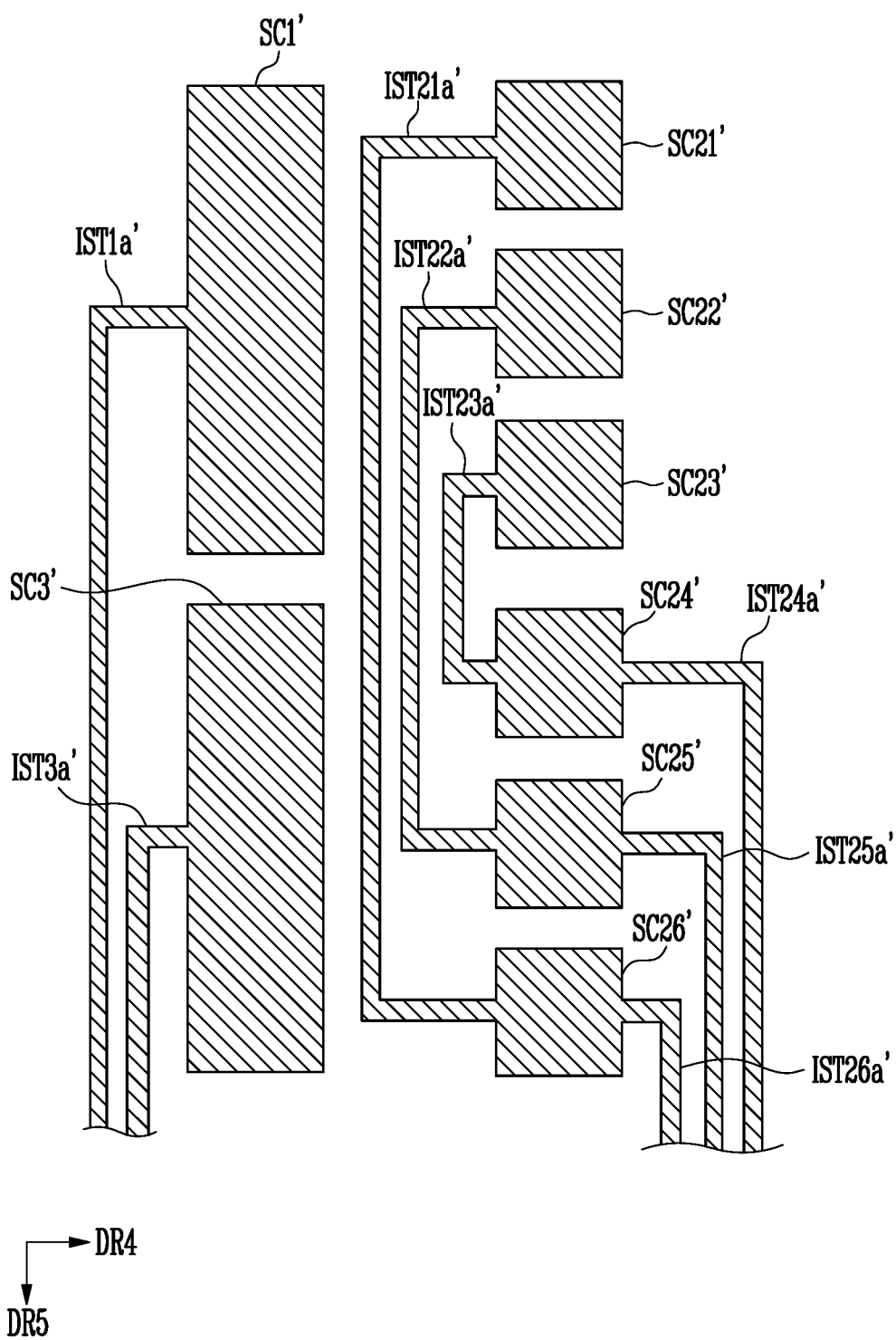

FIGS. 25 and 26 are embodiments of the sense electrodes and the sensing wires in accordance with the embodiment of FIG. 20.

In the embodiments of FIGS. 25 and 26, a bridge electrode may be unnecessarily different from the embodiments of FIGS. 17-19.

For example, as shown in FIG. 25, the sensing electrodes SC1 and SC2 may have substantially the same area and may be connected to the first patterns IST1a and IST2a of the sensing wires IST1 and IST2, respectively. Each of the first patterns IST1a and IST3a may be connected to different first pads PDE1.

In the embodiment of FIG. 26, the area of a first sensing electrode SC1' and the area of second sensing electrodes SC21' to SC26' may be different from each other. For example, the area of the first sensing electrode SC1' may be greater than that of each of the second sensing electrodes SC21' to SC26'. The area of the first sensing electrode SC1' and the area of the third sensing electrode SC3' may be substantially the same. A width of the first sensing electrode SC1' and the third sensing electrode SC3' in a fourth direction DR4 may be greater than a length in a fifth direction DR5.

The first sensing electrode SC1' may correspond to the second sensing electrodes SC21', SC22', and SC23'. For example, the first sensing electrode SC1' may form a mutual capacitance with the most adjacent second sensing electrodes SC21', SC22', and SC23'. Here, the "most adjacent" may refer to a case in which the first sensing electrode SC1' is the most adjacent to the second sensing electrodes SC21', SC22', and SC23' in the fourth direction DR4 or a direction opposite to the fourth direction DR4. In one or more embodiments, a length of the first sensing electrode SC1' in the fifth direction DR5 may correspond to a sum of lengths of the corresponding second sensing electrodes SC21', SC22', and SC23' in the fifth direction DR5.

The third sensing electrode SC3' may correspond to second sensing electrodes SC24', SC25', and SC26'. For example, the third sensing electrode SC3' may form a mutual capacitance with the most adjacent second sensing electrodes SC24', SC25', and SC26'. Herein, the "most adjacent" may refer to a case in which the third sensing electrode SC3' is the most adjacent to the second sensing electrodes SC24', SC25', and SC26' in the fourth direction DR4 or a direction opposite to the fourth direction DR4. In one or more embodiments, a length of the third sensing electrode SC3' in the fifth direction DR5 may correspond to a sum of lengths of the corresponding second sensing electrodes SC24', SC25', and SC26' in the fifth direction DR5.

The first sensing electrode SC1' may be connected to the first pattern IST1a', and the third sensing electrode SC3' may be connected to the first pattern IST3a'. The first patterns IST1a' and IST3a' may be connected to different first pads PDE1, respectively.

The second sensing electrode SC21' may be connected to the second sensing electrode SC24' through the first pattern IST21a'. The second sensing electrode SC22' may be connected to the second sensing electrode SC25' through the first pattern IST22a'. The second sensing electrode SC23' may be connected to the second sensing electrode SC26' through the first pattern IST23a'. The second sensing electrodes SC24', SC25', and SC26' may be connected to different first pads PDE1 through the first patterns IST24a', IST25a', and IST26a', respectively.

For example, the first patterns IST1a' and IST3a' may be connected to reception channels of the touch IC through the first pads PDE1, respectively. For example, the first patterns IST24a', IST25a', and IST26a' may be connected to transmission channels of the touch IC through the first pads PDE1, respectively. The touch IC may sequentially transmit driving signals to the first patterns IST24a', IST25a', and IST26a' and receive sensing signals corresponding to the respective driving signals from the first patterns IST1a' and IST3a'. According to an embodiment, a method of transmitting and receiving a signal may be suitably changed.

The fourth direction DR4 and the fifth direction DR5 may be directions orthogonal to each other. A plane formed by the fourth direction DR4 and the fifth direction DR5 may be parallel to the plane formed by the first direction DR1 and the second direction DR2.

The embodiment of FIG. 26 may reduce the number of the sensing wires IST1 and IST2 connected to the pad in contrast to the embodiment of FIG. 25. In a case of FIG. 25, it is not necessary to sequentially transmit the driving signals, and thus a sensing time may be reduced.

Figure 27:
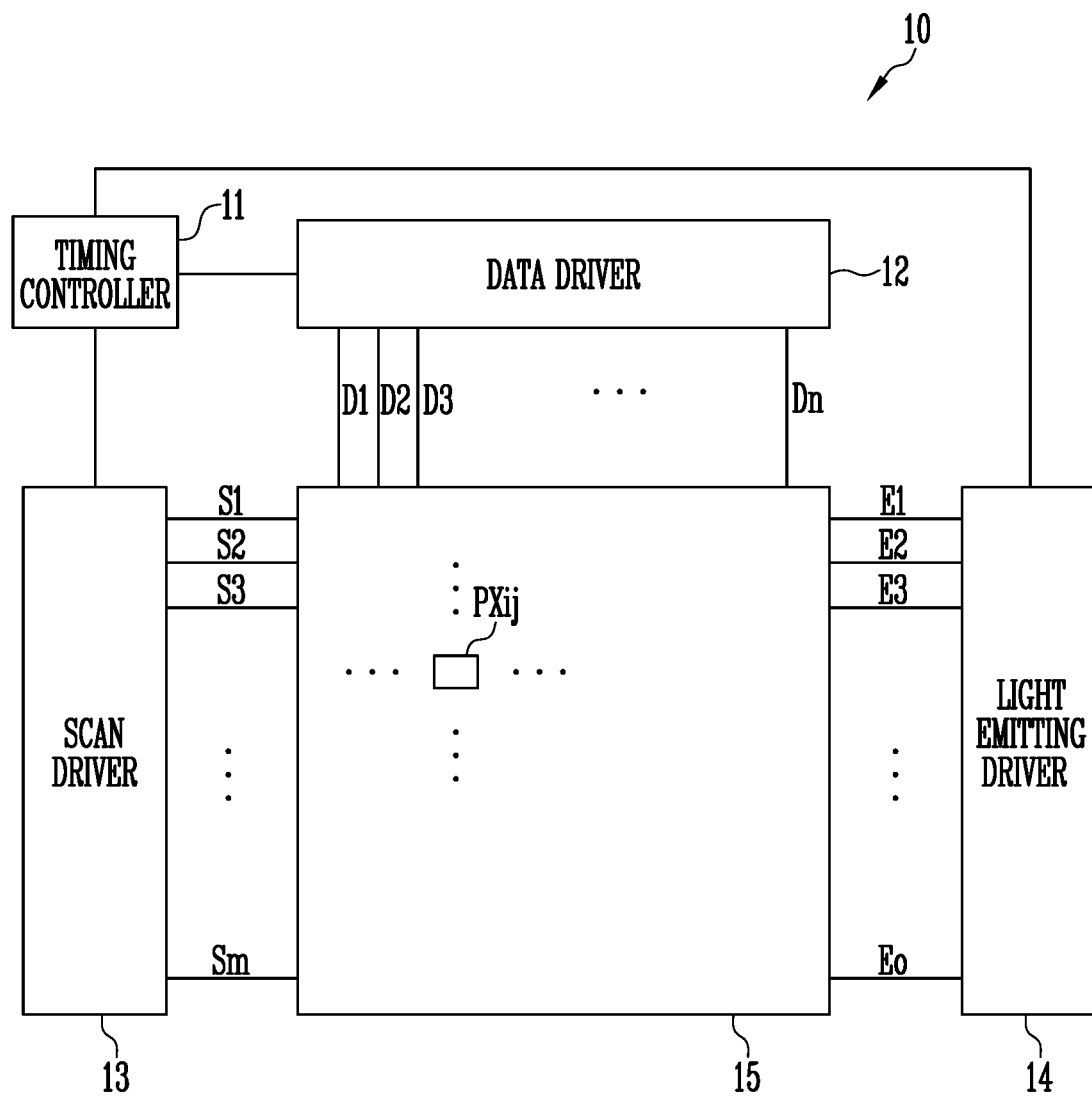
FIGS. 27-29 are diagrams for describing a pixel according to an embodiment of the disclosure.
Figure 28:
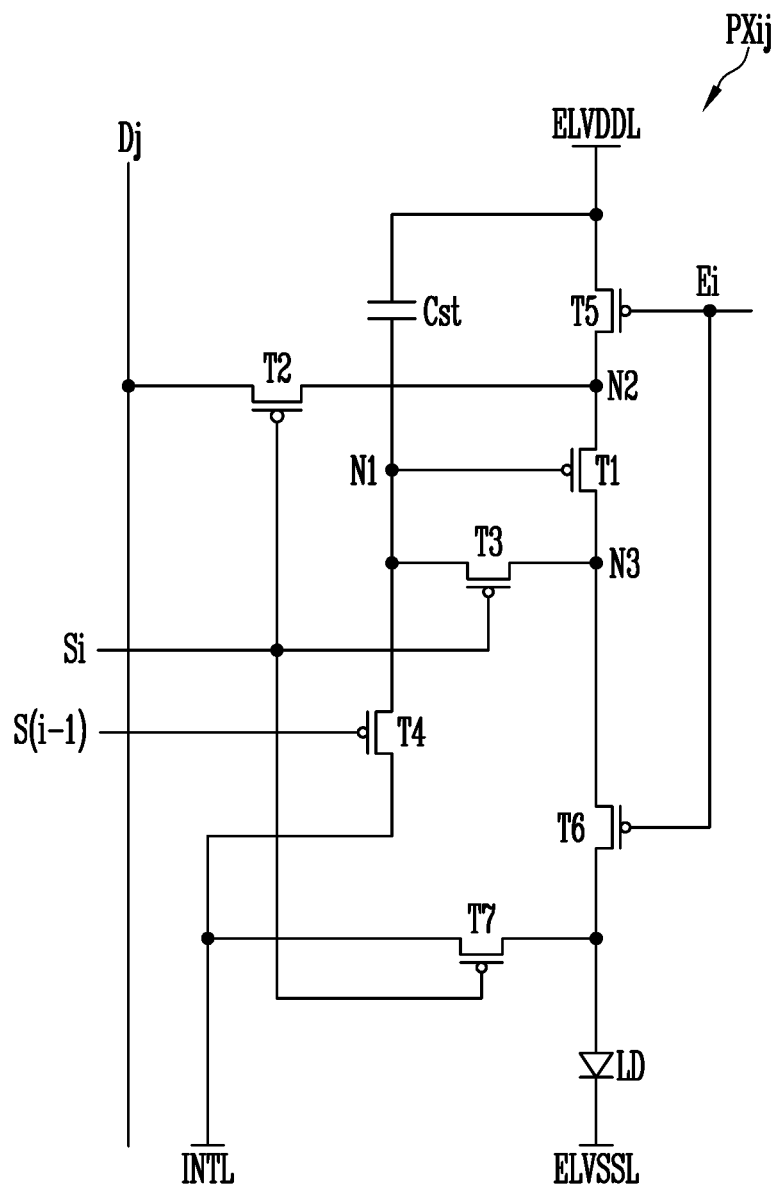
Figure 29:
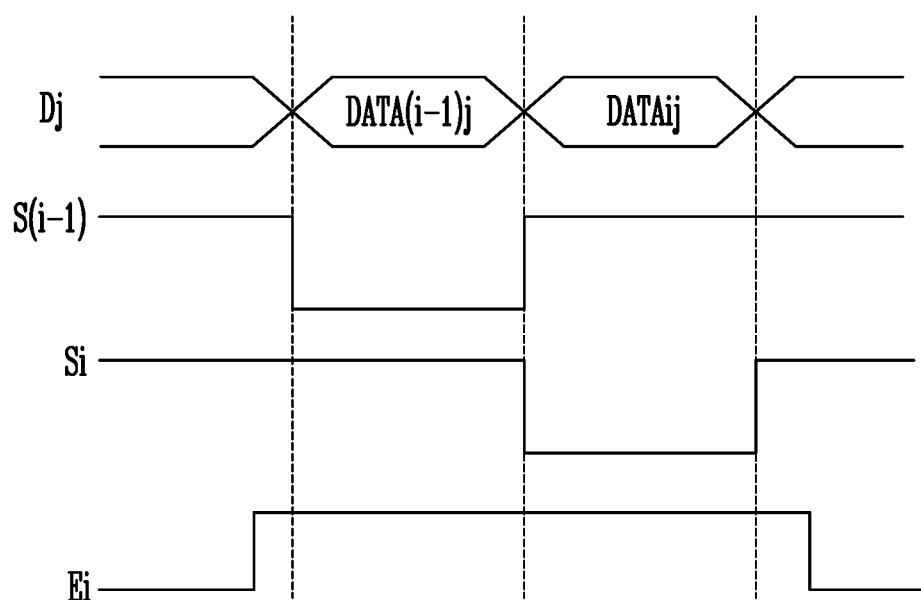

FIGS. 27-29 are diagrams for describing a pixel according to an embodiment of the disclosure.

Referring to FIG. 27, a display device 10 according to an embodiment of the disclosure includes a timing controller 11, a data driver 12, a scan driver 13, a light emitting driver 14, and a pixel unit 15.

The timing controller 11 may receive grayscale values (or gray levels) and control signals for each image frame from an external processor. The timing controller 11 may render the grayscale values to correspond to a specification of the display device 10. For example, the external processor may provide a red grayscale value (or red grayscale level), a green grayscale value (or green grayscale level), and a blue grayscale value (or blue grayscale level) for each unit dot. However, for example, when the pixel unit 15 is a pentile structure, because adjacent unit dots share pixels, the pixels may not correspond to the respective grayscale values on a one-to-one basis. In this case, rendering of the grayscale values is necessary. When the pixels correspond to the respective grayscale values on a one-to-one basis, rendering of the grayscale values may be unnecessary. The grayscale values that are not rendered or rendered may be provided to the data driver 12. In addition, the timing controller 11 may provide the control signals to the data driver 12, the scan driver 13, the light emitting driver 14, and the like suitable for respective specifications to display a frame.

The data driver 12 may generate data voltages to be provided to data lines D1, D2, D3, and Dn using the grayscale values and the control signals. For example, the data driver 12 may sample the grayscale values using a clock signal, and apply the data voltages corresponding to the grayscale values to the data lines D1 to Dn in units of pixel rows, where n may be an integer greater than zero.

The scan driver 13 may receive a clock signal, a scan start signal, and the like from the timing controller 11 to generate scan signals to be provided to scan lines S1, S2, S3, and Sm, where m may be an integer greater than zero.

The scan driver 13 may sequentially supply the scan signals having a pulse of a turn-on level to the scan lines S1, S2, S3, and Sm. The scan driver 13 may include scan stages configured in a form of shift registers. The scan driver 13 may generate the scan signals in a manner of sequentially transferring the scan start signal, which is a pulse form of a turn-on level, to a next scan stage under control of the clock signal.

The light emitting driver 14 may receive a clock signal, a light emitting stop start signal, and the like from the timing controller 11 to generate light emitting signals to be provided to light emitting lines E1, E2, E3, and Eo. For example, the light emitting driver 14 may sequentially provide light emitting signals having a pulse of a turn-off level to the light emitting lines E1 to Eo. For example, each light emitting stage of the light emitting driver 14 may be configured in a form of a shift register, and may generate the light emitting signals in a manner of sequentially transferring the light emitting stop start signal, which is a pulse form of a turn-off level, to a next light emitting stage under control of the clock signal, where o may be an integer greater than zero.

The pixel unit 15 includes pixels. Each pixel PXij may be connected to corresponding data line, scan line, and light emitting line, where i and j may be natural numbers. The pixel PXij may refer to a pixel where a scan transistor is connected to an i-th scan line and a j-th data line. For example, a scan input terminal of the pixel PXij may be connected to the i-th scan line, and a data input terminal of the pixel PXij may be connected to the j-th data line.

Referring to FIG. 28, the pixel PXij includes transistors T1, T2, T3, T4, T5, T6, and T7, a storage capacitor Cst, and a light emitting diode LD.

Hereinafter, a circuit configured of a p-type transistor (p-channel transistor) will be described as an example. However, those skilled in the art will be able to design a circuit configured of an n-type transistor (n-channel transistor) by differentiating a polarity of a voltage applied to a gate terminal. Similarly, those skilled in the art will be able to design a circuit configured of a combination of a p-type transistor and an n-type transistor. The p-type transistors are collectively referred to as transistors in which an amount of a conducted current increases when a voltage difference between a gate electrode and a source electrode increases in a negative direction. The n-type transistors are collectively referred to as transistors in which an amount of conducted current increases when a voltage difference between a gate electrode and a source electrode increases in a positive direction. The transistor may be configured in various suitable forms such as a thin film transistor (TFT), a field effect transistor (FET), and a bipolar junction transistor (BJT).

The first transistor T1 may have a gate electrode connected to a first node N1, a first electrode connected to a second node N2, and a second electrode connected to a third node N3. The first transistor T1 may be referred to as a driving transistor.

The second transistor T2 may have a gate electrode connected to the i-th scan line Si, a first electrode connected to the data line Dj, and a second electrode connected to the second node N2. The second transistor T2 may be referred to as a scan transistor.

The third transistor T3 may have a gate electrode connected to the i-th scan line Si, a first electrode connected to the first node N1, and a second electrode connected to the third node N3. The third transistor T3 may be referred to as a diode-connected transistor.

The fourth transistor T4 may have a gate electrode connected to an (i-1)-th scan line S(i-1), a first electrode connected to the first node N1, and a second electrode connected to an initialization line INTL. In an embodiment, the gate electrode of the fourth transistor T4 may be connected to another scan line. The fourth transistor T4 may be referred to as a gate initialization transistor.

The fifth transistor T5 may have a gate electrode connected to the i-th light emitting line Ei, a first electrode connected to a first power line ELVDDL, and a second electrode connected to the second node N2. The fifth transistor T5 may be referred to as a light emitting transistor. In an embodiment, the gate electrode of the fifth transistor T5 may be connected to another light emitting line.

The sixth transistor T6 may have a gate electrode connected to the i-th light emitting line Ei, a first electrode connected to the third node N3, and a second electrode connected to an anode of the light emitting diode LD. The sixth transistor T6 may be referred to as a light emitting transistor. In an embodiment, the gate electrode of the sixth transistor T6 may be connected to another light emitting line.

The seventh transistor T7 may have a gate electrode connected to the i-th scan line, a first electrode connected to the initialization line INTL, and a second electrode connected to the anode of the light emitting diode LD. The seventh transistor T7 may be referred to as an anode initialization transistor. In an embodiment, the gate electrode of the seventh transistor T7 may be connected to another scan line.

A first electrode of the storage capacitor Cst may be connected to the first power line ELVDDL and a second electrode may be connected to the first node N1.

The anode of the light emitting diode LD may be connected to the second electrode of the sixth transistor T6 and a cathode may be connected to a second power line ELVSSL. The light emitting diode LD may be configured of an organic light emitting diode, an inorganic light emitting diode, a quantum dot light emitting diode, or the like.

The first power line ELVDDL may be supplied with a first power voltage, the second power line ELVSSL may be supplied with a second power voltage, and the initialization line INTL may be supplied with an initialization voltage. For example, the first power voltage may be greater than the second power voltage. For example, the initialization voltage may be equal to or greater than the second power voltage.

A method of driving a pixel according to an embodiment of the disclosure will be described with reference to FIG. 29.

First, a data voltage DATA(i-1)j for an (i-1)-th pixel is applied to the data line Dj and a scan signal of a turn-on level (low level) is applied to the (i-1)-th scan line S(i-1).

In one or more embodiments, because a scan signal of a turn-off level (a high level) is applied to the i-th scan line Si, the second transistor T2 is turned off and the data voltage DATA(i-1)j is substantially prevented or prevented from being drawn into the pixel PXij.

In one or more embodiments, because the fourth transistor T4 is turned on, the first node N1 is connected to the initialization line INTL, and a voltage of the first node N1 is initialized. Because the light emitting signal of the turn-off level is applied to the light emitting line Ei, the transistors T5 and T6 are turned off, and a light emission of an unnecessary light emitting diode LD according to an initialization voltage application process is substantially prevented or prevented.

Next, a data voltage DATAij for the i-th pixel PXij is applied to the data line Dj, and the scan signal of the turn-on level is applied to the i-th scan line Si. Therefore, the transistors T2, T1, and T3 are turned on, and the data line Dj and the first node N1 are electrically connected with each other. Thus, a compensation voltage obtained by subtracting a threshold voltage of the first transistor T1 from the data voltage DATAij is applied to the second electrode of the storage capacitor Cst (that is, the first node N1), and the storage capacitor Cst maintains a voltage corresponding to a difference between the first power voltage and the compensation voltage. Such a period may be referred to as a threshold voltage compensation period.

In one or more embodiments, because the seventh transistor T7 is turned on, the anode of the light emitting diode LD and the initialization line INTL are connected with each other, and the light emitting diode LD is initialized to a charge amount corresponding to a voltage difference between the initialization voltage and the second power voltage.

Thereafter, as the light emitting signal of the turn-on level is applied to the light emitting line Ei, the transistors T5 and T6 may be turned on. Therefore, a driving current path is formed as a path of the first power line ELVDDL, the fifth transistor T5, the first transistor T1, the sixth transistor T6, the light emitting diode LD, and the second power line ELVSSL.

A driving current amount flowing to the first electrode and the second electrode of the first transistor T1 is adjusted according to the voltage maintained in the storage capacitor Cst. The light emitting diode LD emits light at a luminance corresponding to the driving current amount. The light emitting diode LD emits light until the light emitting signal of the turn-off level is applied to the light emitting line Ei.

The drawings referred to so far and the detailed description of the disclosure described herein are merely examples of the disclosure, are used for merely describing the disclosure, and are not intended to limit the meaning and the scope of the disclosure described in claims. Therefore, those skilled in the art will understand that various modifications and equivalent other embodiments are possible from these. Thus, the true scope of the disclosure should be determined by the technical spirit of the appended claims, and equivalents thereof.

What is claimed is:

1. A display device comprising:
   a substrate comprising a display area and a non-display area surrounding an outer periphery of the display area;
   pixels on the display area;
   an encapsulation film on the pixels;
   sensing electrodes on the encapsulation film;
   pads on the non-display area;
   sensing wires connecting the sensing electrodes and the pads;
   a first sensing insulating film on the encapsulation film; and
   a second sensing insulating film on the first sensing insulating film, the sensing electrodes, and the sensing wires,
   wherein a center portion of a first boundary of the second sensing insulating film faces the pads,
   wherein a side portion of the first boundary does not face the pads, and
   wherein the side portion of the first boundary is spaced from a nearest end of the substrate.

2. The display device according to claim 1, wherein the side portion of the first boundary is spaced from the nearest end of the substrate by 200 μm or more.

3. The display device according to claim 1, wherein the substrate comprises a first bending area overlapping the side portion.

4. The display device according to claim 3, wherein the substrate comprises a second bending area between the center portion of the first boundary and the pads, and
   the first bending area and the second bending area do not overlap.

5. The display device according to claim 1, wherein the encapsulation film comprises an organic film,
   the display device further comprising a dam at a boundary of the organic film, and
   wherein the side portion of the first boundary is closer to the nearest end of the substrate than to the dam.

6. The display device according to claim 1, wherein the encapsulation film comprises an organic film,
   the display device further comprising a dam at a boundary of the organic film, and wherein the side portion of the first boundary is farther from the nearest end of the substrate than to the dam.

7. The display device according to claim 6, wherein the side portion of the first boundary is closer to the nearest end of the substrate than to the sensing wires.

8. The display device according to claim 1, wherein the first sensing insulating film is between the encapsulation film and the sensing wires.

9. The display device according to claim 8, wherein the sensing electrodes are on the first sensing insulating film,
the display device further comprising bridge electrodes under the first sensing insulating film, and
wherein the sensing electrodes are connected to the bridge electrodes through contact holes of the first sensing insulating film.

10. The display device according to claim 8, wherein the sensing electrodes are under the first sensing insulating film,
the display device further comprising bridge electrodes on the first sensing insulating film, and
wherein the bridge electrodes are connected to the sensing electrodes through contact holes of the first sensing insulating film.

11. The display device according to claim 1, wherein the first sensing insulating film is between the sensing wires and the second sensing insulating film.

12. The display device according to claim 11, wherein the sensing electrodes are on the first sensing insulating film,
the display device further comprising bridge electrodes under the first sensing insulating film, and
wherein the sensing electrodes are connected to the bridge electrodes through contact holes of the first sensing insulating film.

13. The display device according to claim 11, wherein the sensing electrodes are under the first sensing insulating film,
the display device further comprising bridge electrodes on the first sensing insulating film, and
wherein the bridge electrodes are connected to the sensing electrodes through contact holes of the first sensing insulating film.

14. A display device comprising:
a substrate comprising a display area and a non-display area surrounding an outer periphery of the display area;
pixels on the display area;
an encapsulation film on the pixels;
sensing electrodes on the encapsulation film;
pads on the non-display area;
sensing wires connecting the sensing electrodes and the pads; and
a sensing insulating film on the sensing electrodes and the sensing wires,
where a center portion of a first boundary of the sensing insulating film faces the pads,
wherein a side portion of the first boundary does not face the pads, and
wherein the side portion of the first boundary is spaced from a nearest end of the substrate.

15. The display device according to claim 14, wherein the side portion of the first boundary is spaced from the nearest end of the substrate by 200 μm or more.

* * * * *